(12) United States Patent
Lee et al.

(10) Patent No.: US 10,816,849 B2
(45) Date of Patent: Oct. 27, 2020

(54) LIQUID CRYSTAL DISPLAY DEVICE

(71) Applicant: LG Display Co., Ltd., Seoul (KR)

(72) Inventors: ChangHo Lee, Paju-si (KR); WooNam Jeong, Paju-si (KR); HyeonHo Son, Goyang-si (KR); HanSeok Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/853,773

(22) Filed: Dec. 23, 2017

(65) Prior Publication Data

US 2018/0188606 A1 Jul. 5, 2018

(30) Foreign Application Priority Data

Dec. 30, 2016 (KR) ........................ 10-2016-0184461

(51) Int. Cl.
| | |
|---|---|
| G02F 1/13357 | (2006.01) |
| G02F 1/1335 | (2006.01) |
| G02F 1/1339 | (2006.01) |
| H01L 27/12 | (2006.01) |
| H01L 27/15 | (2006.01) |

(Continued)

(52) U.S. Cl.
CPC ...... *G02F 1/133603* (2013.01); *G02F 1/1339* (2013.01); *G02F 1/133512* (2013.01); *G02F 1/133605* (2013.01); *G02F 1/133606* (2013.01); *G02F 1/133608* (2013.01); *G02F 1/133609* (2013.01); *H01L 27/124* (2013.01); *H01L 27/156* (2013.01); *G02F 2001/133357* (2013.01); *G02F 2001/133601* (2013.01); *G02F 2001/133607* (2013.01); *G02F 2001/133612* (2013.01); *G02F 2001/133613* (2013.01); *G02F 2001/133614* (2013.01); *G02F 2202/108* (2013.01); *H01L 33/06* (2013.01); *H01L 33/32* (2013.01)

(58) Field of Classification Search
CPC ........... G02F 1/133603; G02F 1/13624; G02F 2001/133614; H01L 27/3232
See application file for complete search history.

(56) References Cited

U.S. PATENT DOCUMENTS

| | | |
|---|---|---|
| 2003/0127652 A1 | 7/2003 | Park et al. |
| 2006/0139945 A1 | 6/2006 | Negley et al. |

(Continued)

FOREIGN PATENT DOCUMENTS

| | | |
|---|---|---|
| CN | 1991518 A | 7/2007 |
| CN | 101067698 A | 11/2007 |

(Continued)

OTHER PUBLICATIONS

Chinese Office Action dated Jun. 17, 2020 issued in corresponding Patent Application No. 201711445550.4 (21 pages).

*Primary Examiner* — Jessica M Merlin
(74) *Attorney, Agent, or Firm* — Polsinelli PC

(57) ABSTRACT

Disclosed is a liquid crystal display (LCD) device having a thin thickness. The LCD device includes a liquid crystal display panel and a light source panel coupled to the liquid crystal display panel. The light source panel includes a plurality of emissive areas defined on a base plate, a plurality of light emitting devices respectively disposed in the plurality of emissive areas, and a plurality of concave portions respectively accommodating the plurality of light emitting devices.

29 Claims, 10 Drawing Sheets

(51) Int. Cl.
  *G02F 1/1333*   (2006.01)
  *H01L 33/06*   (2010.01)
  *H01L 33/32*   (2010.01)

(56) References Cited

U.S. PATENT DOCUMENTS

| | | | |
|---|---|---|---|
| 2007/0147075 A1 | 6/2007 | Bang | |
| 2007/0195044 A1 | 8/2007 | Uemoto | |
| 2009/0190330 A1* | 7/2009 | Kim | G02F 1/133603 362/97.2 |
| 2009/0315813 A1 | 12/2009 | Uchino et al. | |
| 2011/0249214 A1* | 10/2011 | Cheong | G02B 6/002 349/61 |
| 2012/0169791 A1* | 7/2012 | Whitehead | G02F 1/133603 345/690 |
| 2013/0256638 A1 | 10/2013 | Uesugi et al. | |
| 2015/0029710 A1* | 1/2015 | Kim | G02F 1/133608 362/217.15 |
| 2015/0194474 A1* | 7/2015 | Choi | H01L 27/3232 349/69 |
| 2015/0219936 A1 | 8/2015 | Kim et al. | |
| 2016/0283028 A1* | 9/2016 | Yamazaki | G02F 1/133345 |
| 2017/0068362 A1* | 3/2017 | Den Boer | G06F 3/0412 |

FOREIGN PATENT DOCUMENTS

| | | |
|---|---|---|
| CN | 103367390 A | 10/2013 |
| CN | 104819404 A | 8/2015 |

\* cited by examiner

LIQUID CRYSTAL DISPLAY DEVICE

CROSS-REFERENCE TO RELATED APPLICATION

This application claims the benefit of the Korean Patent Application No. 10-2016-0184461 filed on Dec. 30, 2016, which is hereby incorporated by reference in its entirety as if fully set forth herein.

BACKGROUND

Field of the Disclosure

The present disclosure relates to a display device, and more particularly to a liquid crystal display (LCD) device.

Description of the Background

An LCD device include a liquid crystal display panel, which displays an image through driving of liquid crystal, and a backlight unit which irradiates light onto the liquid crystal display panel.

The liquid crystal display panel includes a lower substrate including a plurality of pixels which includes a thin film transistor (TFT) and is respectively provided in a plurality of pixel areas defined by intersections of a plurality of gate lines and a plurality of data lines, an upper substrate including a color filter overlapping each of the pixel areas, and a liquid crystal layer disposed between the lower substrate and the upper substrate.

The related art backlight unit uses a plurality of light emitting diodes (LEDs), having high luminance and low power consumption in comparison with fluorescent lamps, as a light source. Since each of the plurality of LEDs can be controlled based on positions, in order to decrease consumption power, the related art backlight unit may be driven in a local dimming method where an LED array is divided into a plurality of blocks, and partial luminance is controlled for each of the plurality of blocks, based on data of pixels overlapping each of the plurality of blocks.

However, in the related art LCD device, a thickness inevitably increases due to a thickness of the backlight unit including a light guide plate and an optical sheet.

SUMMARY

Accordingly, the present disclosure is directed to provide a liquid crystal display (LCD) device that substantially obviates one or more problems due to limitations and disadvantages of the related art.

An aspect of the present disclosure is directed to provide an LCD device having a thin thickness.

Another aspect of the present disclosure is directed to provide an LCD device which has a thin thickness and realizes partial luminance.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a liquid crystal display (LCD) device including a liquid crystal display panel and a light source panel coupled to the liquid crystal display panel, wherein the light source panel includes a plurality of emissive areas defined on a base plate, a plurality of light emitting devices respectively disposed in the plurality of emissive areas, and a plurality of concave portions respectively accommodating the plurality of light emitting devices.

In another aspect of the present disclosure, there is provided a liquid crystal display (LCD) device including a liquid crystal display panel having a liquid crystal layer and a light source panel attached to each other, the light source panel comprising an emissive area on a base plate of the light source panel; a light emitting device corresponding to the emissive area; and an optical gap between the light emitting device and the liquid crystal layer preventing a hot spot caused by the light emitting device, wherein the light emitting device corresponds to a recessed portion of the light source panel to be disposed lower than a top surface of the light source panel.

The LCD device may further include an optical gap member provided between the liquid crystal display panel and the light source panel.

The optical gap member may include a transparent material layer covering the plurality of emissive areas.

The LCD device may further include a gap spacer disposed between the liquid crystal display panel and the light source panel to provide an air gap between the liquid crystal display panel and the light source panel.

The light source panel may further include a light source driving circuit unit including a plurality of light source scan lines and a plurality of light source data lines respectively connected to the plurality of light emitting devices and provided on the base plate to respectively define the plurality of emissive areas and a planarization layer covering the light source driving circuit unit, and the plurality of concave portions may be provided concavely from the planarization layer overlapping the plurality of emissive areas.

The plurality of light emitting devices may each include a first electrode and a second electrode, and the light source panel may include a plurality of first electrode connection patterns provided on the planarization layer, each of the plurality of first electrode connection patterns connecting a first electrode of a corresponding light emitting device of the plurality of light emitting devices to a corresponding driving thin film transistor, and a plurality of second electrode connection patterns provided on the planarization layer, each of the plurality of second electrode connection patterns connecting a second electrode of the corresponding light emitting device of the plurality of light emitting devices to a corresponding common power line.

The base plate of the light source panel may be bonded to the liquid crystal display panel, and in this case, the light source panel may further include a reflective member covering each of the plurality of light emitting devices.

The base plate of the light source panel may be bonded to the optical gap member, and in this case, the light source panel may further include a reflective member covering each of the plurality of light emitting devices.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principle of the disclosure.

In the drawings.

DETAILED DESCRIPTION

Figure 1:
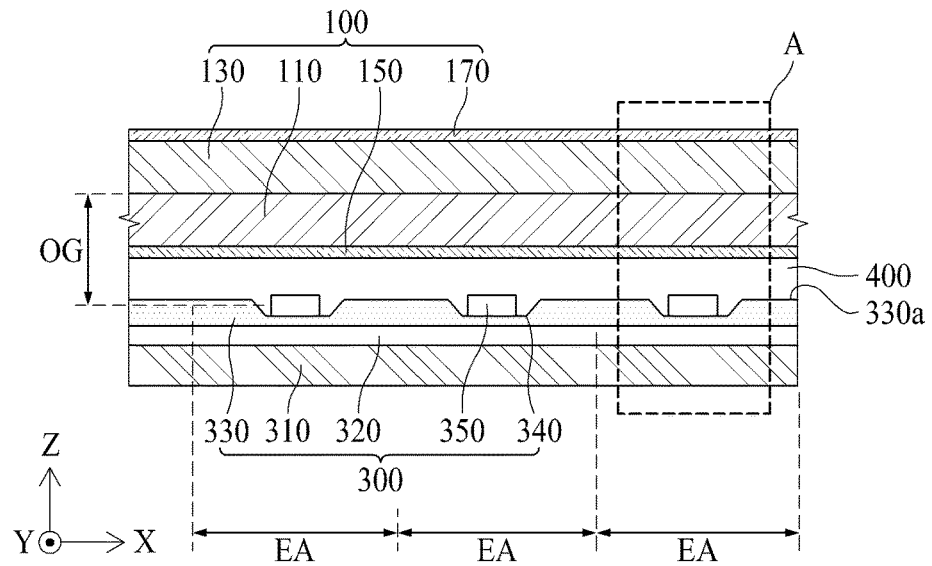
FIG. 1 is a cross-sectional view schematically illustrating an LCD device according to an aspect of the present disclosure.

Reference will now be made in detail to the exemplary aspects of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Furthermore, the present disclosure is only defined by scopes of claims.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, exemplary aspects of a LCD device according to the present disclosure will be described in detail with reference to the accompanying drawings. In the specification, in adding reference numerals for elements in each drawing, it should be noted that like reference numerals already used to denote like elements in other drawings are used for elements wherever possible.

Figure 2:
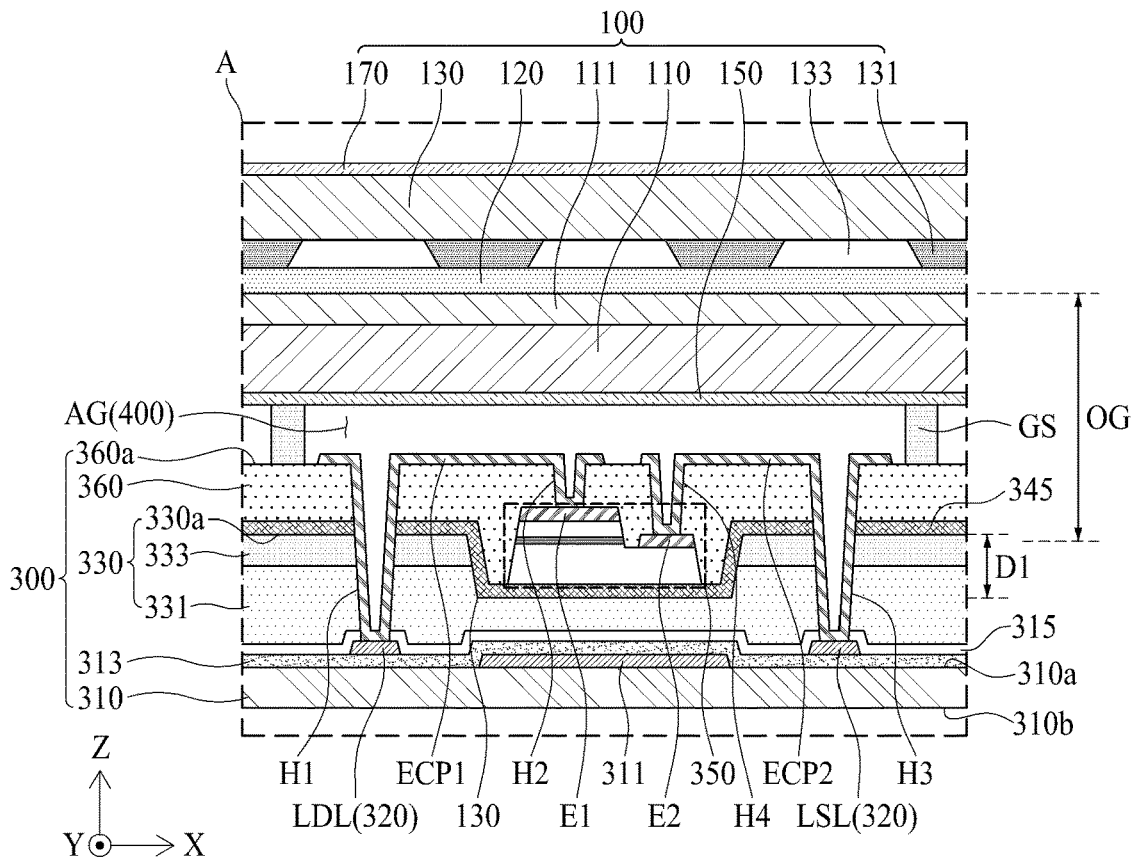
FIG. 2 is an enlarged view illustrating a portion A illustrated in FIG. 1.
Figure 3:
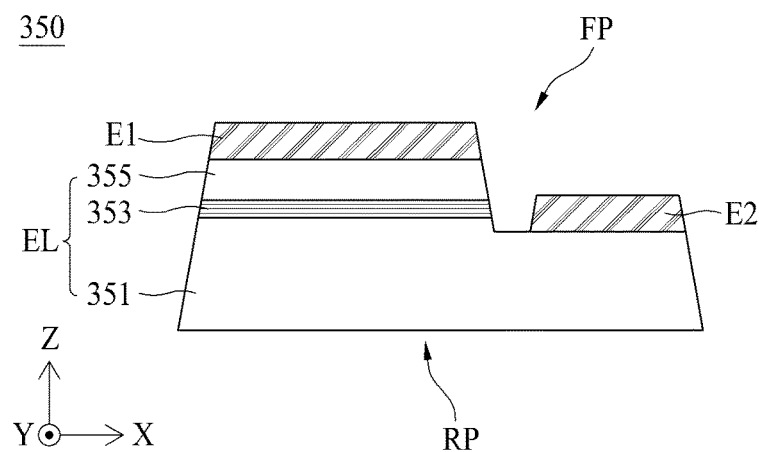
FIG. 3 is a cross-sectional view for describing a structure of a light emitting device illustrated in FIG. 2.

FIG. 1 is a cross-sectional view schematically illustrating an LCD device according to an aspect of the present disclosure, FIG. 2 is an enlarged view illustrating a portion A illustrated in FIG. 1, and FIG. 3 is a cross-sectional view for describing a structure of a light emitting device illustrated in FIG. 2.

Referring to FIGS. 1 to 3, the LCD device according to an aspect of the present disclosure may include a liquid crystal display panel 100 and a light source panel 300.

The liquid crystal display panel 100 may display an image by using light irradiated from the light source panel 300. The liquid crystal display panel 100 according to an aspect may include a lower substrate 110 and an upper substrate 130 which face and are attached to each other with a liquid crystal layer 120 therebetween.

The lower substrate 110 may be a thin film transistor (TFT) array substrate and may include a pixel array unit 111 including a plurality of pixels respectively provided in a plurality of pixel areas defined by a plurality of gate lines and a plurality of data lines. Each of the plurality of pixels may include a TFT connected to a gate line and a data line corresponding thereto, a pixel electrode connected to the TFT, and a common electrode which is provided adjacent to the pixel electrode and is supplied with a common voltage.

The upper substrate 130 may be a color filter array substrate and may include a black matrix 131, which defines an opening area overlapping each of the pixel areas provided on the lower substrate 110, and a color filter 133 provided in the opening area. The upper substrate 130 faces and attached to the lower substrate 110 with the liquid crystal layer 120 therebetween by using a sealant.

The liquid crystal layer 120 may be disposed between the lower substrate 110 and the upper substrate 130 and may include liquid crystal including liquid crystal molecules of which an alignment direction is adjusted according to an electric field generated based on a voltage difference between a common voltage applied to a common electrode and a data voltage applied to a pixel electrode provided in each pixel.

The liquid crystal display panel 100 according to an aspect may further include a lower polarization member 150 and an upper polarization member 170.

The lower polarization member 150 may be attached on a lower surface of the lower substrate 110 to polarize light, irradiated from the light source panel 300 onto the lower substrate 110, to a first polarization axis.

The upper polarization member 170 may be attached on an upper surface of the upper substrate 130 to polarize light, output to the outside via the upper substrate 130, to a second polarization axis different from the first polarization axis.

The liquid crystal display panel 100 may drive the liquid crystal layer 120 with the electric field which is generated in each pixel by the common voltage and the data voltage applied to each pixel, thereby displaying an image with light passing through the liquid crystal layer 120.

The light source panel 300 may be coupled to the lower substrate 110 of the liquid crystal display panel 100 and may irradiate light onto a whole rear surface of the liquid crystal display panel 100. The light source panel 300 according to an aspect may include a base plate 310, a light source driving circuit unit 320, a planarization layer 330, a plurality of concave portions 340, and a plurality of light emitting devices 350.

The base plate 310 may be formed of a glass material, a plastic material, and/or the like. The base plate 310 according to an aspect may be coupled to the rear surface of the liquid crystal display panel 100, and for example, may be formed of a glass material rather than a plastic material, for securing and maintaining a rigidity of the liquid crystal display panel 100. For example, the base plate 310 may include one of sapphire glass and gorilla glass or a stacked glass thereof.

The light source driving circuit unit 320 may be provided on the base plate 310 and may allow the plurality of light emitting devices 350 to emit lights. The light source driving circuit 320 according to an aspect may allow the plurality of light emitting devices 350 to emit the lights through global dimming or local dimming, based on light source data supplied a display driving circuit unit.

The light source driving circuit unit 320 according to an aspect may allow the plurality of light emitting devices 350 to emit the lights according to a passive matrix driving manner, thereby allowing high-luminance light to be irradiated onto the liquid crystal display panel 100. The light source driving circuit unit 320 according to an aspect may include a plurality of light source scan lines LSL, provided on the base plate 310, and a plurality of light source data lines LDL intersecting the light source scan lines LSL.

The plurality of light source scan lines LSL may be provided on a front surface 310a of the base plate 310 and may be spaced apart from each other by a certain interval along a first direction to long extend along a second direction. Here, the first direction may be parallel to a long side lengthwise direction or a horizontal direction of the base plate 310, and the second direction may be parallel to a short side lengthwise direction or a vertical direction of the base plate 310. The first direction and the second direction may switch therebetween.

The plurality of light source scan lines LSL according to an aspect may each be formed of a first metal material. For example, the light source scan lines LSL may each be formed of the same material as that of the gate lines provided on the lower substrate 110 of the liquid crystal display panel 100. The light source scan lines LSL may be covered by a gate insulation layer 313.

The plurality of light source data lines LDL may be provided on the front surface 310a of the base plate 310 to intersect the plurality of light source scan lines LSL. That is, each of the plurality of light source data lines LDL may be spaced apart from an adjacent light source data line by a certain interval along the second direction and may be provided on the gate insulation layer 313 to long extend along the first direction.

The plurality of light source data lines LDL according to an aspect may each be formed of a second metal material. For example, the plurality of light source data lines LDL may each be formed of the same material as that of the data lines provided on the lower substrate 110 of the liquid crystal display panel 100, or may each be formed of the same material as that of the light source scan lines LSL. The plurality of light source data lines LDL may be covered by an interlayer dielectric 315 provided on the gate insulation layer 313. Optionally, the interlayer dielectric 315 may be omitted.

The plurality of light source scan lines LSL and the plurality of light source data lines LDL may be provided on the base plate 310 to intersect one another, and thus, may define a plurality of emissive areas having a matrix type on the base plate 310. Here, one emissive area EA may have the same size as that of each of the pixels provided in the liquid crystal display panel 100, the same size as that of one unit pixel including at least three pixels, or a size which is greater than two or more unit pixels.

The planarization layer 330 may be provided on the base plate 310 to cover the light source driving circuit unit 320. That is, the planarization layer 330 may be provided on a front surface of the base plate 310 to cover the plurality of light source data lines LDL or the interlayer dielectric 315. The planarization layer 330 may provide a planar surface on the light source driving circuit unit 320.

The planarization layer 330 according to an aspect may include a transparent layer 331 and a light blocking layer 333.

The transparent layer 331 may provide a first planar surface on the light source driving circuit unit 320 and may be provided on the whole front surface of the base plate 310 to cover the plurality of light source data lines LDL or the interlayer dielectric 315. For example, the transparent layer 331 may be formed of an organic material such as benzocyclobutene or photo acryl, but for convenience of a process, the transparent layer 331 may be formed of photo acryl.

The light blocking layer 333 may provide a second planar surface on the light source driving circuit unit 320 and may cover the transparent layer 331 other than the plurality of concave portions 340. The light blocking layer 333 may include a light absorbing material. For example, the light blocking layer 333 may be formed of the same material as that of a black matrix 131 provided on the upper substrate 130 of the liquid crystal display panel 100. The light blocking layer 333 prevents light corresponding to an area between adjacent emissive areas from traveling toward the base plate 310.

The plurality of concave portions 340 may be respectively provided in the plurality of emissive areas defined in the base plate 310 and may respectively accommodate the light emitting devices 350. The plurality of concave portions 340 according to an aspect may be provided concavely from the planarization layer 330. For example, each of the plurality of concave portions 340 may have a groove or cup form having a certain depth from an upper surface 330a of the planarization layer 330. The plurality of concave portions 340 may be provided concavely from the planarization layer 330 and may respectively accommodate the light emitting devices 350, thereby minimizing an increase in thickness of the light source panel 300 caused by a thickness (or a height) of each of the light emitting devices 350.

Each of the plurality of concave portions 340 according to an aspect may be provided concavely from the upper surface 330a of the planarization layer 330 by removing only the light blocking layer 333 of the planarization layer 330 provided in a corresponding emissive area or by removing a portion or all of the transparent layer 331 of the planarization layer 330, and may be determined based on a thickness (or a height) of each of the light emitting devices 350. In this case, a depth of each of the plurality of concave portions 340 may be set in order for an uppermost portion of each of the light emitting devices 350 to be disposed on the same horizontal line as the upper surface 330a of the planarization layer 330, and in this case, an increase in thickness of the light source panel 300 caused by a thickness of each of the light emitting devices 350 can be minimized.

Each of the plurality of light emitting devices 350 may be accommodated into a corresponding concave portion of the plurality of concave portions 340 and may be connected to the light source driving circuit unit 320. Each of the plurality of light emitting devices 350 may emit light with a light source driving current supplied from the light source driving circuit unit 320 to irradiate the light onto the rear surface of the liquid crystal display panel 100.

Each of the plurality of light emitting devices 350 according to an aspect may be a micro light-emitter, a micro LED, or a micro LED chip, which emits white light. Here, the micro LED chip may have a scale of 1 μm to 100 μm, but is not limited thereto. In other aspects, the micro LED chip may have a size which is less than that of each of the emissive areas defined in the base plate 310.

A micro white LED chip according to an aspect may include a micro first color LED chip emitting light of a first color and a phosphor layer including a phosphor which is coated on a light output surface of the micro first color LED chip and converts some of incident lights of the first color into lights of a second color. In this case, the micro white LED chip may finally emit white light according to a combination of light of the first color and light of the second color. Here, the first color may be blue, and the second color may be yellow.

The concave portions 340 according to an aspect may each include an inclined surface provided between a floor and the upper surface 330a of the planarization layer 330, and the inclined surface may allow light, emitted from a corresponding light emitting device 350 accommodated into a corresponding concave portion 340, to travel toward a region in front of the corresponding concave portion 340.

Each of the plurality of light emitting devices 350 may be mounted on a corresponding concave portion 340 and may be electrically connected to the light source driving circuit unit 320 to emit light according to a light source data signal supplied from the light source driving circuit unit 320. Each of the plurality of light emitting devices 350, as illustrated in FIG. 3, may include a light emitting layer EL, a first electrode (or an anode terminal) E1, and a second electrode (or a cathode terminal) E2.

The light emitting layer EL may emit light according to a recombination of an electron and a hole based on a current flowing between the first electrode E1 and the second electrode E2. The light emitting layer EL according to an aspect may include a first semiconductor layer 351, an active layer 353, and a second semiconductor layer 355.

The first semiconductor layer 351 may provide an electron to the active layer 353. The first semiconductor layer 351 according to an aspect may be formed of an n-GaN-based semiconductor material, and the n-GaN-based semiconductor material may be GaN, AlGaN, InGaN, AlInGaN, or the like. Here, impurities used for doping of the first semiconductor layer 351 may use silicon (Si), germanium (Ge), selenium (Se), tellurium (Te), carbon (C), or the like.

The active layer 353 may be provided on one side of the first semiconductor layer 351. The active layer 353 may have a multi quantum well (MQW) structure including a well layer and a barrier layer having a band gap higher than that of the well layer. The active layer 353 according to an aspect may have the MQW structure such as InGaN/GaN.

The second semiconductor layer 355 may be provided on the active layer 353 and may provide a hole to the active layer 353. The second semiconductor layer 355 according to an aspect may be formed of a p-GaN-based semiconductor material, and the p-GaN-based semiconductor material may be GaN, AlGaN, InGaN, AlInGaN, or the like. Here, impurities used for doping of the second semiconductor layer 355 may use magnesium (Mg), zinc (Zn), beryllium (Be), or the like.

The first electrode E1 may be provided on the second semiconductor layer 355. The first electrode E1 may be connected to an adjacent light source data line LDL.

The second electrode E2 may be provided on the other side of the first semiconductor layer 351 and may be electrically disconnected from the active layer 353 and the second semiconductor layer 355. The second electrode E2 may be connected to an adjacent light source scan line LSL.

Each of the first and second electrodes E1 and E2 according to an aspect may be formed of a material including one or more materials of a metal material, such as gold (Au), tungsten (W), platinum (Pt), silicon (Si), iridium (Ir), silver (Ag), copper (Cu), nickel (Ni), titanium (Ti), or chromium (Cr), and an alloy thereof. In other aspects, each of the first and second electrodes E1 and E2 may be formed of a transparent conductive material, and examples of the transparent conductive material may include indium tin oxide (ITO), indium zinc oxide (IZO), etc. However, the present aspect is not limited thereto.

In addition, the first semiconductor layer 351, the active layer 353, and the second semiconductor layer 355 may be provided in a structure of being sequentially stacked on a semiconductor substrate. Here, the semiconductor substrate may include a semiconductor material included in a sapphire substrate or a silicon substrate. The semiconductor substrate may be used as a growth semiconductor substrate for growing each of the first semiconductor layer 351, the active layer 353, and the second semiconductor layer 355, and then, may be separated from the first semiconductor layer 351 through a substrate separation process. Here, the substrate separation process may be a laser lift-off process or a chemical lift-off process. Therefore, since the growth semiconductor substrate is removed from the light emitting devices 350, each of the light emitting devices 350 has a thin thickness, and thus, may be accommodated into a corresponding concave portion 340 provided in each of subpixels SP.

The light emitting device 350 may emit light according to a recombination of an electron and a hole based on a current flowing between the first electrode E1 and the second electrode E2. In this case, the light emitted from the light emitting device 350 may pass through the first and second electrodes E1 and E2 and may be output to the outside. In other words, the light emitted from the light emitting device 350 may pass through the first and second electrodes E1 and E2 and may be output in a second direction opposite to a first direction toward the floor of the concave portion 340, thereby displaying an image.

The light emitting device 350 may include a first portion (or a front portion) FP, including the first and second electrodes E1 and E2 connected to the light source driving circuit unit 320, and a second portion (or a rear portion) RP opposite to the first portion FP. In this case, the first portion FP may be disposed relatively farther away from the floor of the concave portion 340 than the second portion RP. Here, the first portion FP may have a size which is smaller than the second portion RP, and in this case, the light emitting device 350 may have a cross-sectional surface having a trapezoid shape which includes an upper surface corresponding to the first portion FP and a lower surface corresponding to the second portion RP.

The light source panel 300 according to an aspect may further include a passivation layer 360, a plurality of first electrode connection patterns ECP1, and a plurality of second electrode connection patterns ECP2.

The passivation layer 360 may be provided on the planarization layer 330 to cover the plurality of light emitting devices 350. That is, the passivation layer 360 may be provided on the planarization layer 330 to have a thickness which enables the passivation layer 360 to cover a front surface of the other accommodating space of the concave portion 340 into which the light emitting device 350 is accommodated. The passivation layer 360 may provide a planar surface on the planarization layer 330. Also, the passivation layer 360 may be buried into the other accommodating space of the concave portion 340 into which the light emitting device 350 is accommodated, thereby fixing a position of the light emitting device 350. The passivation layer 360 according to an aspect may be formed of an organic material such as benzocyclobutene or photo acryl, but for convenience of a process, the passivation layer 360 may be formed of photo acryl.

Each of the plurality of first electrode connection patterns ECP1 may connect the first electrode E1 of a corresponding light emitting device of the plurality of light emitting devices 350 to a corresponding light source data line LDL. Each of the plurality of first electrode connection patterns ECP1 may be provided as a pattern type on an upper surface 360a of the passivation layer 360 overlapping the light source data line LDL and the first electrode E1 of the light emitting device 350. One side of each of the plurality of first electrode connection patterns ECP1 may be electrically connected to the light source data line LDL through a first contact hole H1 passing through the planarization layer 330 and the passivation layer 360, and the other side of each of the plurality of first electrode connection patterns ECP1 may be electrically connected to the first electrode E1 of the light emitting device 350 through a second contact hole H2 passing through the passivation layer 360. Therefore, the first electrode E1 of the light emitting device 350 may be electrically connected to the light source data line LDL through the first electrode connection pattern ECP1.

Each of the plurality of second electrode connection patterns ECP2 may connect the second electrode E2 of a corresponding light emitting device of the plurality of light emitting devices 350 to a corresponding light source scan line LSL. Each of the plurality of second electrode connection patterns ECP2 may be provided as a pattern type on the upper surface 360a of the passivation layer 360 overlapping the light scan data line LSL and the second electrode E2 of the light emitting device 350. One side of each of the plurality of second electrode connection patterns ECP2 may be electrically connected to the light source scan line LSL through a third contact hole H3 passing through the planarization layer 330 and the passivation layer 360, and the other side of each of the plurality of second electrode connection patterns ECP2 may be electrically connected to the second electrode E2 of the light emitting device 350 through a fourth contact hole H4 passing through the passivation layer 360. Therefore, the second electrode E2 of the light emitting device 350 may be electrically connected to the light source scan line LSL through the second electrode connection pattern ECP2.

Each of the plurality of first and second electrode connection patterns ECP1 and ECP2 may be provided on a corresponding light emitting device of the light emitting devices 350. If the light source panel 300 has a top emission type, each of the plurality of first and second electrode connection patterns ECP1 and ECP2 may be formed of a transparent conductive material, and if the light source panel 300 has a bottom emission type, each of the plurality of first and second electrode connection patterns ECP1 and ECP2 may be formed of a light reflection conductive material. Here, the transparent conductive material may be indium tin oxide (ITO), indium zinc oxide (IZO), or the like, but is not limited thereto. The light reflection conductive material may be Al, Ag, Au, Pt, Cu, or the like, but is not limited thereto. Each of the plurality of first and second electrode connection patterns ECP1 and ECP2 including the light reflection conductive material may be formed of a single layer including the light reflection conductive material or a multilayer including a plurality of the single layers which are stacked.

The plurality of first and second electrode connection patterns ECP1 and ECP2 according to an aspect may be simultaneously provided through an electrode patterning process using a lithography process, an etching process, and a deposition process of depositing an electrode material on the passivation layer 360 including the first to fourth contact holes H1 to H4. Therefore, in the present aspect, since the plurality of first and second electrode connection patterns ECP1 and ECP2 for connecting the first and second electrodes E1 and E2 of each of the plurality of light emitting devices 350 to the light source driving circuit unit 320 are simultaneously formed, an electrode connection process is simplified, and a process time taken in the electrode connection process is considerably shortened, thereby enhancing a productivity of the light source panel 300.

The light source panel 300 according to an aspect may further include a plurality of reflective patterns 311 respectively overlapping the plurality of emissive areas.

The reflective pattern 311 may be provided between the floor of the concave portion 340 and the base plate 310 to overlap the emissive area including the light emitting device 350. The reflective pattern 311 may be formed of a material which is the same as that of the light source scan line LSL, and may be provided on the same layer as the light source scan line LSL. As another example, the reflective pattern 311 may be formed of a material which is the same as that of the light source data line LDL, and may be provided on the same layer as the light source data line LDL. The reflective pattern 311 may reflect light, which is incident from the light emitting device 350, toward the first portion FP of the light emitting device 350. Accordingly, the display device according to the present aspect may include the reflective pattern 311, and thus, may have a top emission structure. However, if the display device according to the present aspect has a bottom emission structure, the reflective pattern 311 may be omitted.

Optionally, in the display device according to the present aspect, each of the light emitting devices 350 may be attached on the floor of a corresponding concave portion of the plurality of concave portions 340 by using an adhesive member 345.

The adhesive member 345 may be disposed between the concave portion 340 of each emissive area and the light emitting device 350 and may attach the light emitting device 350 on the floor of the concave portion 340, thereby primarily fixing the light emitting device 350.

The adhesive member 345 according to an aspect may be attached (coated) on the second portion RP of the light emitting device 350 (i.e., a back surface of the first semiconductor layer 310), and thus, in a mounting process of mounting the light emitting device 350 onto the concave portion 340, the adhesive member 345 may be adhered to the concave portion 340 of each subpixel SP.

In other aspects, the adhesive member 345 may be dotted onto the concave portion 340 of each emissive area and may be spread by pressure which is applied thereto in a mounting process performed for the light emitting device 350, and thus, may be adhered to the second portion RP of the light emitting device 350. Therefore, the light emitting device 350 mounted on the concave portion 340 may be primarily position-fixed by the adhesive member 345. Accordingly, according to the present aspect, the mounting process for the light emitting device 350 may be performed in a method of simply attaching the light emitting device 350 on the floor of the concave portion 340, and thus, a mounting process time taken in performing the mounting process for the light emitting device 350 is considerably shortened.

In other aspects, the adhesive member 345 may be coated on the upper surface 330a of the planarization layer 330 and the floor and the inclined surface of the concave portion 340. That is, the adhesive member 345 may be provided to wholly cover a portion of a front surface of the planarization layer 330 except the contact holes H1 to H4. In other words, the adhesive member 345 may be disposed between the planarization layer 330 and the passivation layer 360 and may be disposed between the planarization layer 330 and the light emitting device 350. In other aspects, the adhesive member 345 may be coated on the whole upper surface 330a of the planarization layer 330, where the concave portion 340 is provided, to have a certain thickness. A portion of the adhesive member 345 coated on the upper surface 330a of the planarization layer 330, where the contact holes H1 to H4 are to be provided, may be removed when forming the contact holes H1 to H4. Therefore, in the present aspect, immediately before a mounting process for the light emitting device 350, the adhesive member 345 may be coated on the whole upper surface 330a of the planarization layer 330 to have a certain thickness, and thus, according to the present aspect, a process time taken in forming the adhesive member 335 is considerably shortened.

In the present aspect, the adhesive member 345 may be provided on a whole upper surface of the passivation layer 360, and thus, the passivation layer 360 according to the present aspect is provided to cover the adhesive member 345.

The light source panel 300 may be coupled to a rear surface of the liquid crystal display panel 100 by a sealant. That is, the light source panel 300 may be coupled to a rear edge of the liquid crystal display panel 100 by the sealant.

The sealant according to an aspect may be provided along the rear edge of the liquid crystal display panel 100 or a front edge of the light source panel 300 and may be attached on the rear edge of the liquid crystal display panel 100 and the front edge of the light source panel 300, thereby coupling the light source panel 300 to the rear surface of the liquid crystal display panel 100. Here, an upper surface of the sealant may be coupled to the lower polarization member 150 or the lower substrate 110 of the liquid crystal display panel 100, and a lower surface of the sealant may be coupled to the passivation layer 360 of the light source panel 300.

The LCD device according to the present aspect may further include an optical gap member 400 provided between the liquid crystal display panel 100 and the light source panel 300.

The optical gap member 400 may include an air gap AG provided between the liquid crystal display panel 100 and the light source panel 300.

The air gap AG may increase a refractive index difference between two adjacent mediums to increase refraction or axial-direction reflection of light emitted from the light source panel 300, thereby increasing luminance uniformity.

Optionally, the LCD device according to the present aspect may further include a plurality of gap spacers GS which are provided between the liquid crystal display panel 100 and the light source panel 300 to provide the air gap AG between the liquid crystal display panel 100 and the light source panel 300.

Each of the plurality of gap spacers GS may be provided to have a certain height from an upper surface of the light source panel 300. That is, the gap spacers GS may be vertically provided on the passivation layer 360 to each have the certain height and may be arranged at predetermined intervals. Each of the plurality of gap spacers GS may support the rear surface of the liquid crystal display panel 100 and may provide the air gap AG between the liquid crystal display panel 100 and the light source panel 300.

The LCD device according to the present aspect may include an optical gap OG which is provided between the light emitting layer EL of the light emitting device 350 and the liquid crystal layer 120 of the liquid crystal display panel 100 and corresponds to a distance therebetween.

The optical gap OG may be set for minimizing or preventing hot spots caused by each of the plurality of light emitting devices 350. That is, the optical gap OG is for preventing hot spots from being caused by a light-oriented angle of each of the plurality of light emitting devices 350. Here, the hot spots can occur due to a luminance difference between a bright area, on which light emitted from each of the plurality of light emitting devices 350 is irradiated, and a dark area on which the light emitted from each of the plurality of light emitting devices 350 is not irradiated. The hot spots can be prevented or minimized by the optical gap OG based on the light-oriented angle and a pitch of each of the plurality of light emitting devices 350.

A height of each of the plurality of gap spacers GS according to the present aspect may be set based on the optical gap OG. That is, in the present aspect, a height of each of the plurality of gap spacers GS may be set based on the optical gap OG, and thus, the air gap AG may be provided between the liquid crystal display panel 100 and the light source panel 300, thereby preventing the hot spots.

The LCD device according to the present aspect may display an image by using light irradiated from the light source panel 300 onto the liquid crystal display panel 100 including the plurality of light emitting devices 350, and thus, a configuration of the backlight unit which includes a light source, a light guide plate, and optical sheets is simplified. Also, the light guide plate and the optical sheets are removed, and thus, the LCD device has a thin thickness. Particularly, since the light emitting device 350 is accommodated into the concave portion 340 provided in the emissive area, a thickness of the light source panel 300 is reduced, and thus, the LCD device has a thinner thickness.

Figure 4:
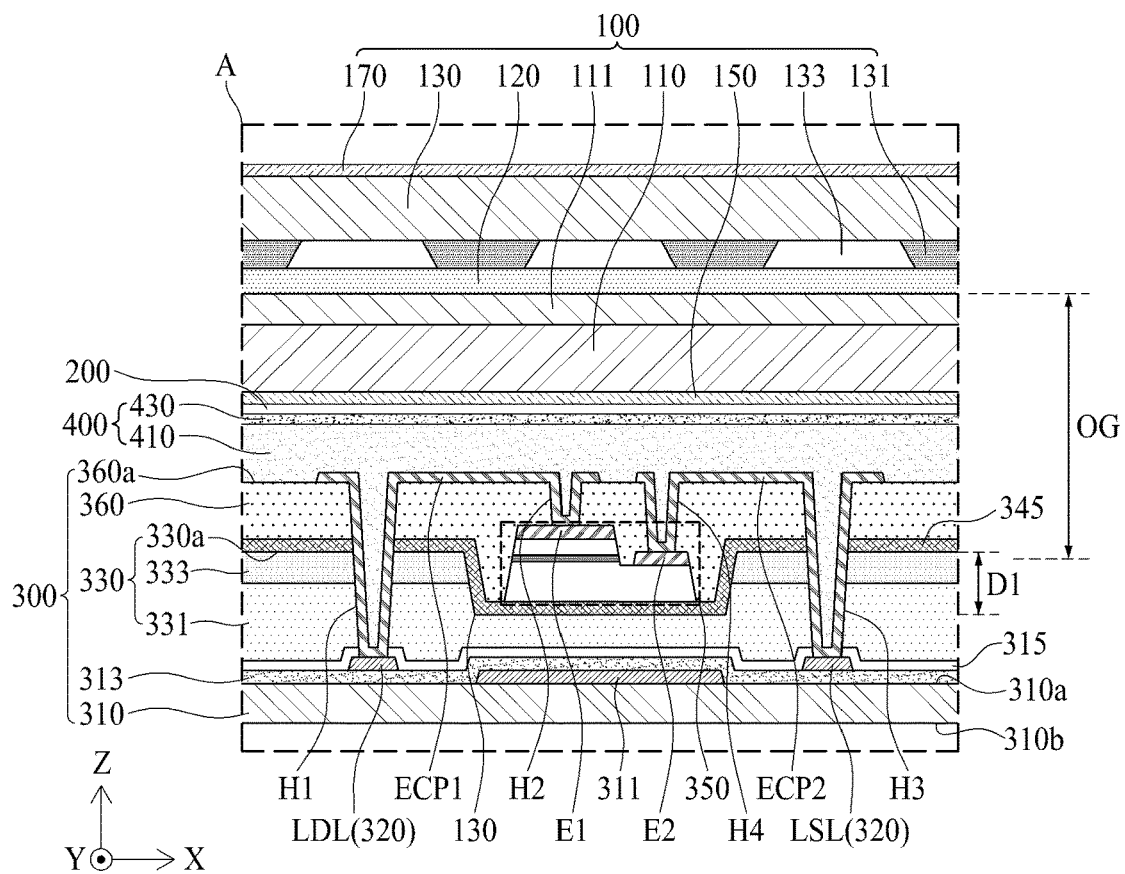
FIGS. 4 to 8 are other enlarged views illustrating a portion A illustrated in FIG. 1.

FIG. 4 is another enlarged view illustrating in more detail a portion A illustrated in FIG. 1 and illustrates an example where an optical gap member and a panel coupling member are added to the light source panel illustrated in FIG. 2.

Referring to FIG. 4, an LCD device according to the present aspect may include a liquid crystal display panel 100, a light source panel 300, an optical gap member 400, and a panel coupling member 200.

The liquid crystal display panel 100 is the same as the illustration of FIG. 2, and thus, its repetitive description is omitted.

Except that a sealant and a plurality of spacers are removed from the light source panel illustrated in FIG. 2, the light source panel 300 has the same configuration as that of the light source panel of FIG. 2, and thus, its repetitive description is omitted.

The optical gap member 400 may be provided to cover a whole front surface of the light source panel 300. For example, the optical gap member 400 may include a transparent material layer 410.

The transparent material layer 410 according to an aspect may be coated by a certain thickness to cover a whole front surface of a passivation layer 360 including a plurality of first and second electrode connection patterns ECP1 and ECP2 and first to fourth contact holes H1 to H4 provided in the light source panel 300, and then, may be cured, whereby the transparent material layer 410 may be provided on the whole front surface of the light source panel 300. The optical gap member 400 may be provided as one body with the front surface of the light source panel 300 to protect the front surface of the light source panel 300, and may provide an optical gap OG between a light emitting layer EL of the light emitting device 350 and a liquid crystal layer 120 of the liquid crystal display panel 100.

A thickness of the optical gap member 400 according to an aspect may be set based on the optical gap OG. That is, in the present aspect, a thickness (or a depth) of the optical gap member 400 including the transparent material layer 410 may be set based on the optical gap OG, thereby preventing the hot spots.

Additionally, the optical gap member 400 according to an aspect may further include a light scattering layer 430.

The light scattering layer 430 may be provided on an upper surface of the transparent material layer 410 to have a haze of 50%. For example, the light scattering layer 430 may include an acryl bead or a scattering bead such as a silica porous body. The light scattering layer 430 may scatter lights incident from the plurality of light emitting devices 350 to additionally decrease the hot spots.

The panel coupling member 200 may be attached on the whole front surface of the optical gap member 400 and may be coupled to the liquid crystal display panel 100, thereby opposite-bonding the liquid crystal display panel 100 to the light source panel 300. That is, the liquid crystal display panel 100 and the light source panel 300 face and attached to each other through a direct bonding process by using the panel coupling member 200. The panel coupling member 200 according to an aspect may be an optical clear adhesive (OCA) or an optical clear resin (OCR), and in order to provide an air gap between the liquid crystal display panel 100 and the light source panel 300, the panel coupling member 200 may include a porous OCA or a porous OCR.

The LCD device according to the present aspect has the same effect as that of the LCD device illustrated in FIG. 2, and the liquid crystal display panel 100 and the light source panel 300 may be bonded to each other through the direct bonding process by using the panel coupling member 200, thereby simplifying a manufacturing process.

Figure 5:
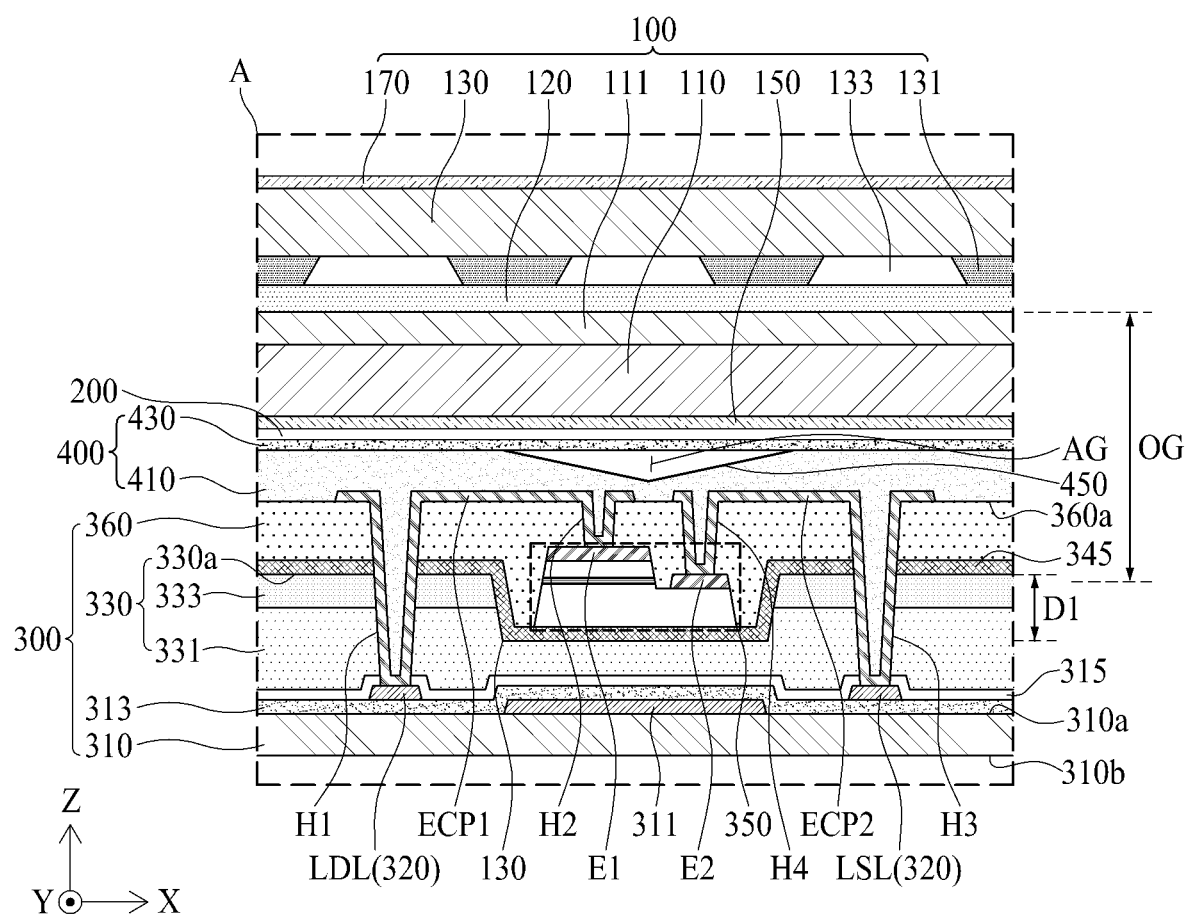

FIG. 5 is another enlarged view illustrating in more detail a portion A illustrated in FIG. 1 and illustrates an example where a plurality of lens patterns are added to the optical gap member illustrated in FIG. 2. Hereinafter, therefore, only the plurality of lens patterns and elements relevant thereto will be described, and descriptions of the other elements are omitted.

Referring to FIG. 5, an LCD device according to the present aspect may include an optical gap member 400, and the optical gap member 400 may include a plurality of lens patterns 450.

The plurality of lens patterns 450 may be concavely provided in the optical gap member 400 to respectively overlap a plurality of light emitting devices 350. That is, each of the plurality of lens patterns 450 may be provided concavely in a direction from an upper surface 400a of the optical gap member 400, overlapping each of the plurality of light emitting devices 350, to a center of a corresponding light emitting device 350.

Each of the plurality of lens patterns 450 may have a conical shape including a conical surface having an inclined straight line form. That is, each of the plurality of lens patterns 450 may include a circle-shaped base side provided on an upper surface 400a of the optical gap member 400, a vertex facing the light emitting device 350, and a conical surface provided in an inclined straight line form between the vertex and the base side. Here, the vertex of the lens pattern 450 may overlap a center of the light emitting device 350, and the base side of the lens pattern 450 may have a diameter which is greater than a maximum length of the light emitting device 350 with respect to the vertex.

Each of the plurality of lens patterns 450 according to an aspect may have a conical shape including a conical surface having a concave curve form or may have a dome shape including a cross-sectional surface having a semicircular or elliptical shape.

Each of the plurality of lens patterns 450 may refract and/or reflect light emitted in a vertical direction from the center of the light emitting device 350, thereby minimizing or preventing hot spots which occur in an area overlapping the center of the light emitting device 350.

The LCD device according to the present aspect may further include an air gap AG provided between each of the plurality of lens patterns 450 provided in the optical gap member 400 and the liquid crystal display panel 100. The air gap AG may increase a refractive index difference between two adjacent mediums to increase refraction or axial-direction reflection of light emitted through each of the plurality of lens patterns 450, thereby increasing luminance uniformity.

The LCD device according to the present aspect has the same effect as that of the LCD device illustrated in FIG. 2, and the light emitted in the vertical direction from the center of the light emitting device 350 may be refracted and/or reflected by the lens pattern 450, thereby further minimizing or preventing the hot spots which occur in the area overlapping the center of the light emitting device 350.

Figure 6:
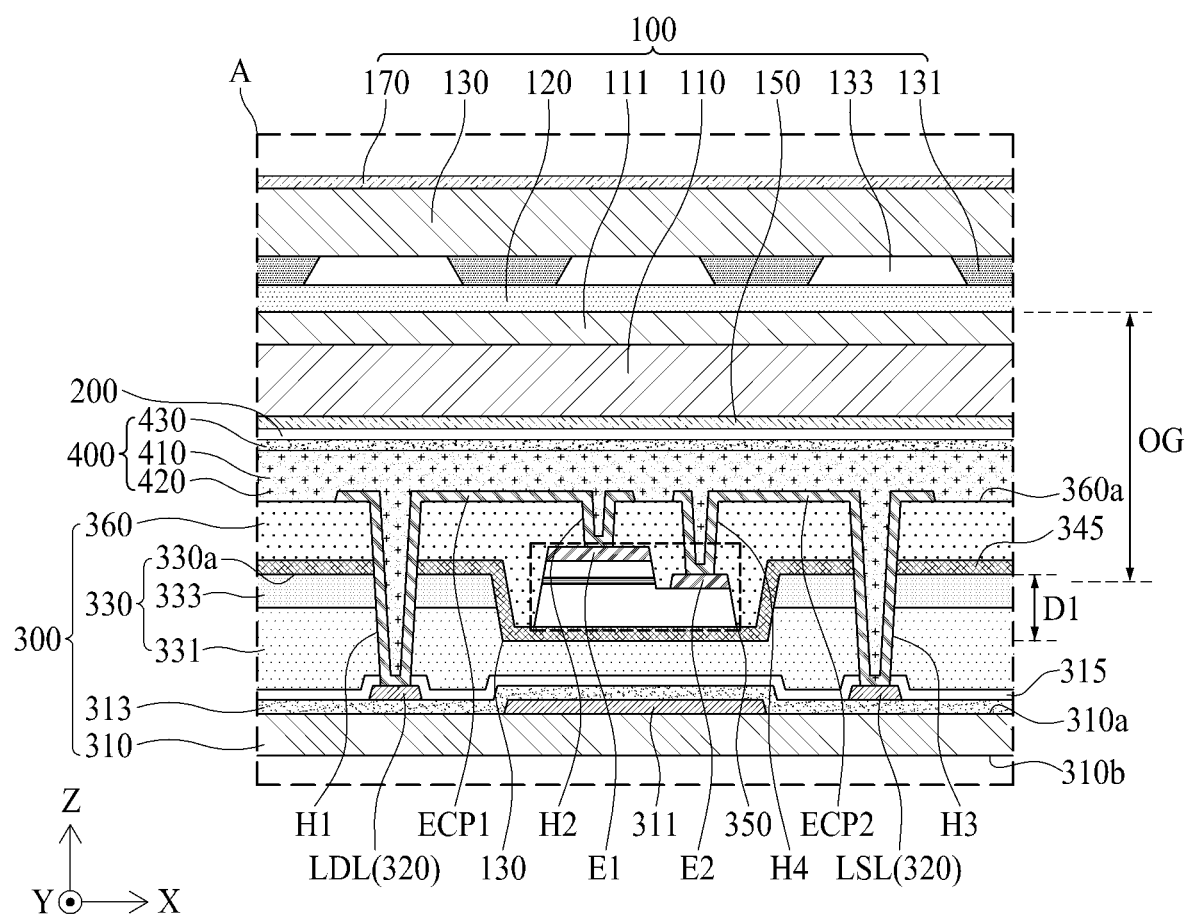

FIG. 6 is another enlarged view illustrating in more detail a portion A illustrated in FIG. 1 and illustrates an example which is implemented by modifying a configuration of each of the light emitting device and the optical gap member illustrated in FIG. 4. Hereinafter, therefore, only a light emitting device and an optical gap member will be described, and descriptions of the other elements are omitted.

Referring to FIG. 6, an LCD device according to the present aspect may include a plurality of light emitting devices 350 provided in a light source panel 300, and each of the plurality of light emitting devices 350 may be configured with a micro LED chip which emits light of a first color except white. For example, each of the plurality of light emitting devices 350 may be configured with a micro blue LED chip which emits blue light.

The optical gap member 400 of the LCD device according to the present aspect may include a wavelength converting material 420 that converts some of lights of the first color, emitted from the plurality of light emitting devices 350, into lights of a second color.

The wavelength converting material 420 may absorb the light of the first color and may emit the light of the second color through re-emission, thereby allowing white light, based on a combination of the light of the second color and the light of the first color emitted from each of the plurality of light emitting devices 350, to be irradiated onto a liquid crystal display panel 100. For example, the light of the second color may be yellow light.

The wavelength converting material 420 according to an aspect may include a phosphor or a quantum dot.

The phosphor according to an aspect may be a yellow phosphor which is excited by blue light to emit yellow light, and for example, may be an yttrium aluminum garnet (YAG)-based material.

The quantum dot according to an aspect may be excited by blue light to emit yellow light and may have a size for emitting light having a yellow wavelength, and for example, may include CdS, CdSe, CdTe, ZnS, ZnSe, GaAs, GaP, GaAs—P, Ga—Sb, InAs, InP, InSb, AlAs, AlP, AlSb, and/or the like.

A transparent resin containing the wavelength converting material 420 may be coated by a certain thickness to cover a whole front surface of a passivation layer 360 including a plurality of first and second electrode connection patterns ECP1 and ECP2 and first to fourth contact holes H1 to H4 provided in the light source panel 300, and then, by curing the coated transparent resin through a curing process using heat and/or light, the optical gap member 400 according to an aspect may be formed.

The optical gap member 400 according to an aspect may be formed by a sheet attachment process of attaching a transparent sheet, including the transparent resin containing the wavelength converting material 420, on the whole front surface of the passivation layer 360 including the plurality of first and second electrode connection patterns ECP1 and ECP2 and the first to fourth contact holes H1 to H4 provided in the light source panel 300. In this case, the transparent sheet may be attached on a whole front surface of the light source panel 300 by using a sheet attachment member including an OCA, an OCR, a porous OCA, or a porous OCR.

Additionally, the optical gap member 400 according to the present aspect may further include a plurality of lens patterns 450 illustrated in FIG. 5. Each of the plurality of lens patterns 450 may refract and/or reflect light emitted in a vertical direction from a center of the light emitting device 350, thereby minimizing or preventing hot spots which occur in an area overlapping the center of the light emitting device 350.

In the LCD device according to the present aspect, white light based on a combination of the light of the first color emitted from the light emitting device 350 and the light of the second color emitted by the wavelength converting material 420 of the optical gap member 400 may be irradiated onto the liquid crystal display panel 100, and thus, hot spots caused by the light emitting device 350 are minimized or prevented. Also, light emitted in a vertical direction from a center of the light emitting device 350 may be refracted and/or reflected by the lens pattern 450, thereby further minimizing or preventing the hot spots which occur in an area overlapping the center of the light emitting device 350.

Figure 7:
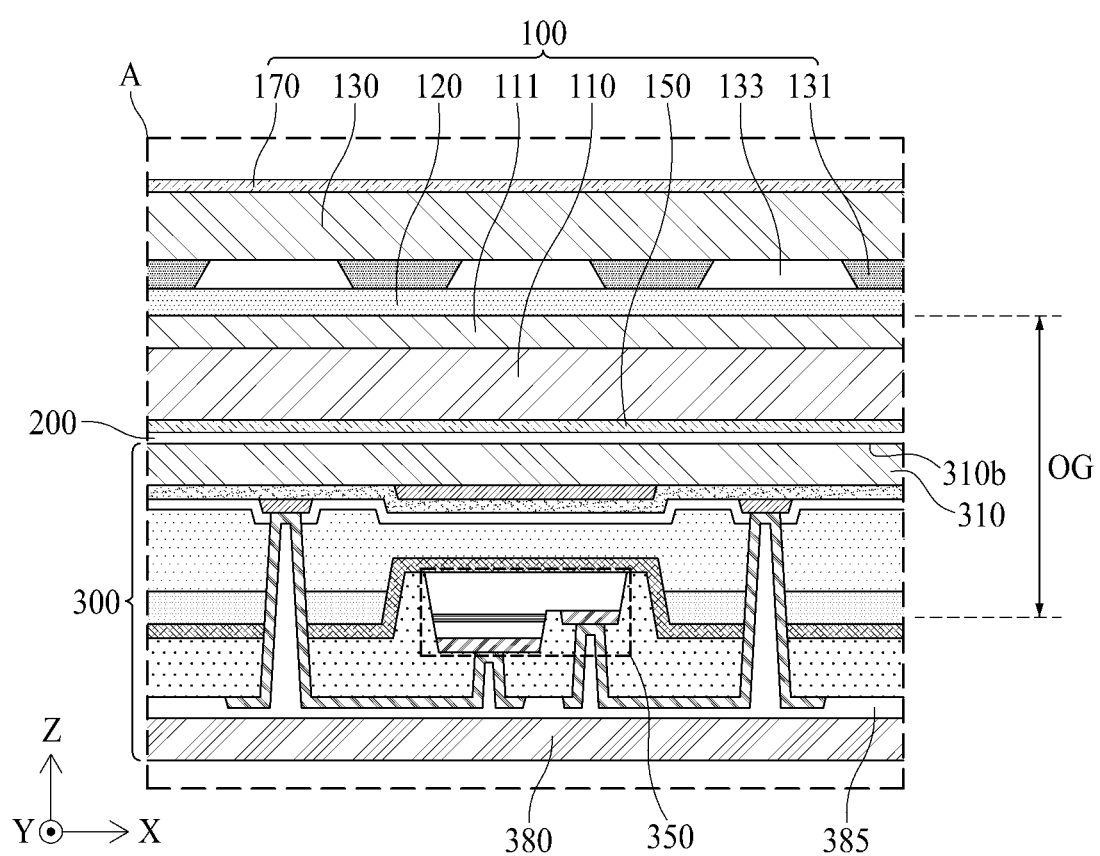

FIG. 7 is another enlarged view illustrating a portion A illustrated in FIG. 1 and illustrates an example which is implemented by modifying a bonding structure of the light source panel and the liquid crystal display panel illustrated in FIG. 4. Hereinafter, therefore, only a bonding structure of a light source panel and a liquid crystal display panel and elements relevant thereto will be described, and descriptions of the other elements are omitted.

Referring to FIG. 7, a light source panel 300 according to the present aspect may be vertically reversed and may be coupled to a rear surface of a liquid crystal display panel 100. That is, a base plate 310 of the light source panel 300 may be coupled to a lower substrate 110 (or a lower polarization member) of the liquid crystal display panel 100 by using a panel coupling member 200.

The panel coupling member 200 according to an aspect may include an OCA, an OCR, a porous OCA, or a porous OCR, or in order to provide an air gap between the liquid crystal display panel 100 and the light source panel 300, the panel coupling member 200 may include a porous OCA or a porous OCR.

The base plate 310 of the light source panel 300 and the lower substrate 110 of the liquid crystal display panel 100 face and are attached to each other through a direct bonding process by using the panel coupling member 200. Therefore, since the light source panel 300 is coupled to a rear surface of the liquid crystal display panel 100 through vertical reverse, the light source panel 300 may have a bottom emission structure, and thus, a reflective pattern 311 provided in the base plate 310 may be omitted.

The base plate 310 of the light source panel 300 coupled to the lower substrate 110 of the liquid crystal display panel 100 may act as an optical gap member which provides an optical gap OG between an light emitting layer EL of the light emitting device 350 and a liquid crystal layer 120 of the liquid crystal display panel 100. Therefore, in the present aspect, the optical gap member 400 illustrated in FIG. 4 may be omitted, and moreover, the gap spacer illustrated in FIG. 2 may be omitted.

Additionally, since the base plate 310 is coupled to the lower substrate 110 of the liquid crystal display panel 100, the light source panel 300 may further include a reflector 380 covering a whole front surface of the base plate 310.

The reflector 380 may be attached on a front surface of the base plate 310 by using a transparent adhesive member 385. The reflector 380 according to an aspect may include a material having a high reflectance. For example, the reflector 380 according to an aspect may be formed of a light reflecting material such as Al, Ag, Au, Pt, or Cu. The reflector 380 may reflect light, which is incident from the light emitting device 350, toward the liquid crystal display panel 100, thereby minimizing the loss of light.

The transparent adhesive member 385 may include an OCA or an OCR.

Optionally, the light source panel 300 according to the present aspect may further include a plurality of lens patterns which are concavely provided on a rear surface of the base plate 310 overlapping the light emitting device 350 to face a rear surface of the liquid crystal display panel 100. Except that the plurality of lens patterns are provided on the rear surface of the base plate 310, the plurality of lens patterns are the same as the lens pattern illustrated in FIG. 5, and thus, their detailed descriptions are omitted.

Since the light source panel 300 according to the present aspect is vertically reversed and is coupled to a rear surface of the liquid crystal display panel 100, an optical gap OG is secured by the base plate 310 of the light source panel 300, thereby minimizing or preventing hot spots.

Figure 8:
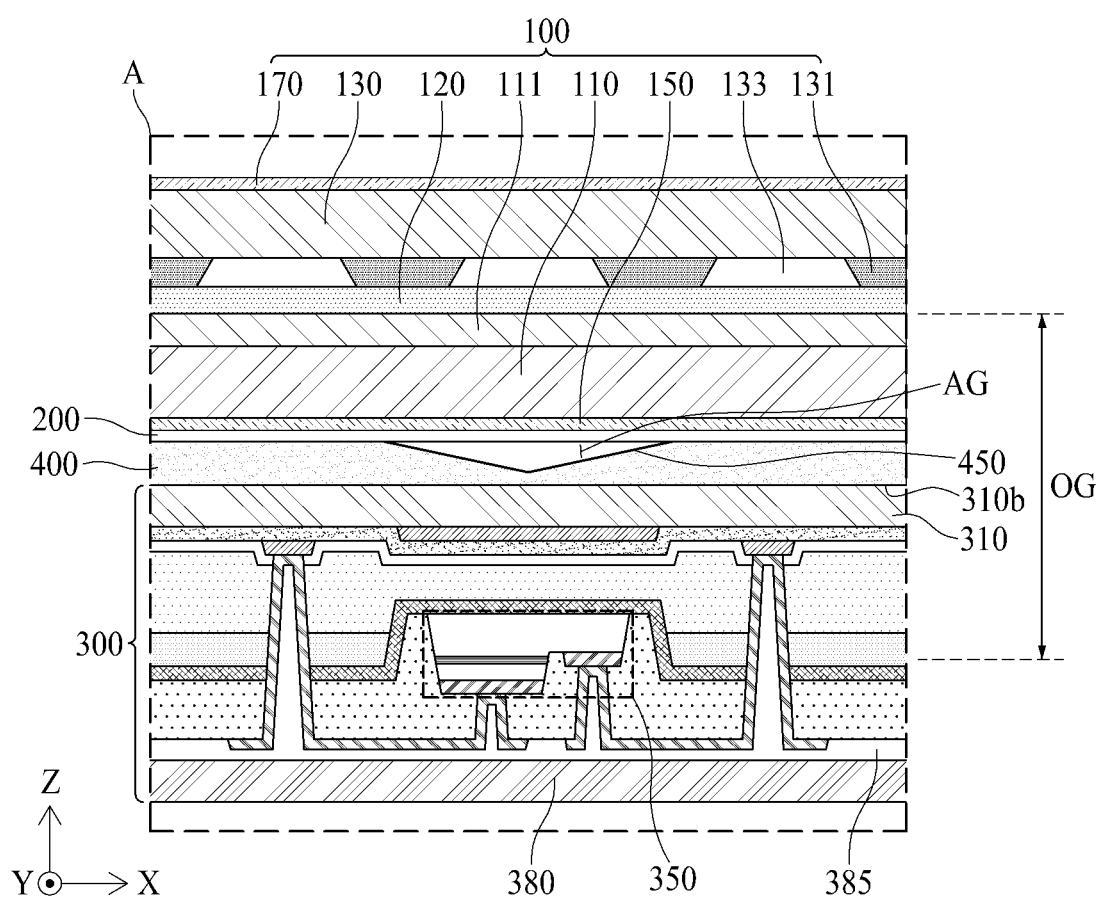

FIG. 8 is another enlarged view illustrating in more detail a portion A illustrated in FIG. 1 and illustrates an example which is implemented by modifying a bonding structure of the light source panel and the liquid crystal display panel illustrated in FIG. 5. Hereinafter, therefore, only a bonding structure of a light source panel and a liquid crystal display panel and elements relevant thereto will be described, and descriptions of the other elements are omitted.

Referring to FIG. 8, an LCD device according to the present aspect may include an optical gap member 400 provided between a liquid crystal display panel 100 and a light source panel 300, and the light source panel 300 may be vertically reversed and may be coupled to a rear surface of the optical gap member 400. Except that the light source panel 300 is vertically reversed and is coupled to the rear surface of the optical gap member 400, the LCD device according to the present aspect is the same as the LCD device illustrated in FIG. 5, and thus, repetitive descriptions of elements other than the optical gap member 400 and elements relevant thereto are omitted.

In the present aspect, the optical gap member 400 may be provided between a base plate 310 of the light source panel 300 and the liquid crystal display panel 100. That is, the optical gap member 400 may be provided on the base plate 310 of the light source panel 300 to have a certain thickness and may be coupled to a rear surface of the liquid crystal display panel 100 by using a panel coupling member 200.

Optionally, as illustrated in FIG. 6, the optical gap member 400 according to the present aspect may further include the wavelength converting material 420.

In the LCD device according to the present aspect, since the light source panel 300 is vertically reversed and is coupled to the rear surface of the optical gap member 400, an optical gap OG is secured by the base plate 310 of the light source panel 300 and the optical gap member 400, thereby minimizing or preventing hot spots.

Figure 9:
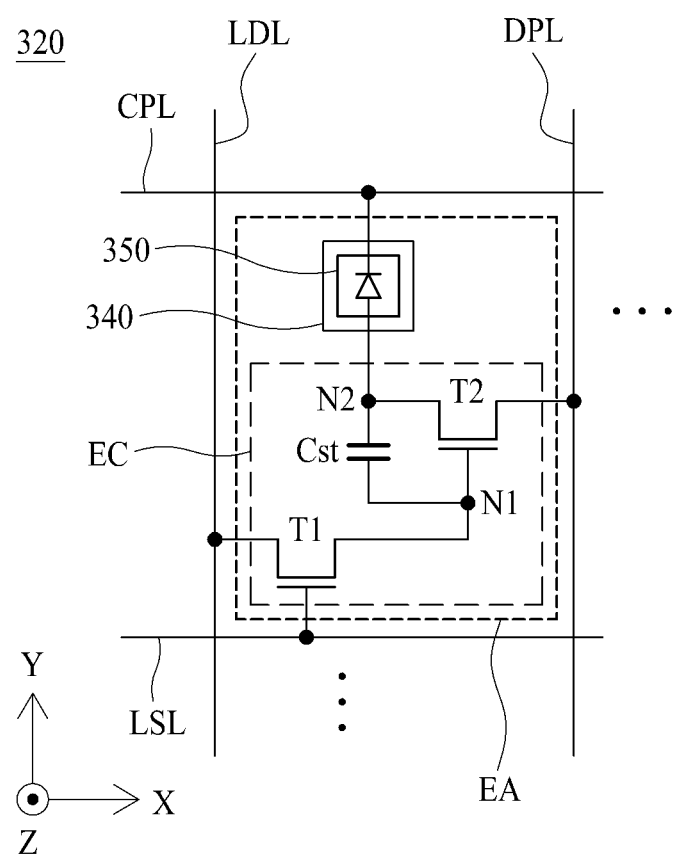
FIG. 9 is a diagram for describing a light source driving circuit unit provided in a light source panel of an LCD device according to an aspect of the present disclosure.

FIG. 9 is a diagram for describing a light source driving circuit unit provided in a light source panel of an LCD device according to an aspect of the present disclosure.

Referring to FIG. 9, a light source driving circuit unit 320 of a light source panel 300 according to the present aspect may allow each of a plurality of light emitting devices 350 to emit light in an active matrix driving manner, thereby precisely controlling a partial luminance of an LCD device 100. The light source driving circuit unit 320 according to an aspect may include a plurality of light source scan lines LSL, a plurality of light source data lines LDL, and a plurality of light emitting circuits EC.

Each of the plurality of light source scan lines LSL may be provided on a front surface 310a of a base plate 310 to long extend along a second direction and may be spaced apart from an adjacent light source scan line by a certain interval along a first direction. The plurality of light source data lines LDL may be provided on the front surface 310a of the base plate 310 to intersect the plurality of light source scan lines LSL.

The plurality of light source scan lines LSL and the plurality of light source data lines LDL may be provided on the base plate 310 to intersect one another, and thus, may define a plurality of emissive areas EA on the base plate 310. Each of the plurality of emissive areas EA may be defined as a minimum-unit area which emits light. One emissive area EA may have the same size as that of each of pixels provided in the liquid crystal display panel 100, the same size as that of one unit pixel including at least three pixels, or a size which is greater than two or more unit pixels.

The light source driving circuit unit 320 according to an aspect may further include a plurality of driving power lines DPL and a plurality of common power lines CPL.

The plurality of driving power lines DPL may be provided on the base plate 310 in parallel with the plurality of light source data lines LDL and may be formed along with the plurality of light source data lines LDL. The plurality of common power lines CPL may be provided on the base plate 310 in parallel with the plurality of light source scan lines LSL and may be formed along with the plurality of light source scan lines LSL.

Each of the plurality of light emitting circuits EC may be provided in a corresponding emissive area EA defined on the base plate 310 and may be connected to an adjacent light source scan line LSL, light source data line LDL, and driving power line DPL and a corresponding light emitting device 350. The light emitting circuit EC may control a current flowing in the light emitting device 350 according to a light source data signal supplied through the light source data line LDL in response to a scan pulse supplied through the light source scan line LSL, based on a light source driving power supplied through the driving power line DPL. Each of the plurality of light emitting circuits EC according to an aspect may include a switching TFT T1, a driving TFT T2, and a capacitor Cst.

The switching TFT T1 may include a gate electrode connected to a light source scan line LSL, a first electrode connected to a light source data line LDL, and a second electrode connected to a gate electrode of the driving TFT T2 through a first node N1. Here, each of the first and second electrodes of the switching TFT T1 may be a source electrode or a drain electrode depending on a direction of a current. The switching TFT T1 may be turned on according to the scan pulse supplied through the light source scan line LSL and may supply the light source data signal, supplied through the light source data line LDL, to the gate electrode of the driving TFT T2.

The driving TFT T2 may be turned on by a voltage supplied through the switching TFT T1 and/or a voltage of the capacitor Cst to control the amount of current flowing from the driving power line DPL to the light emitting device 350. To this end, the driving TFT T2 according to an aspect may include a gate electrode connected to the second electrode of the switching TFT T1, a drain electrode connected to a driving power line DPL, and a source electrode connected to a light emitting device 350 through a second node N2. The driving TFT T2 may control a data current flowing from the driving power line DPL to the light emitting device 350 according to the light source data signal supplied through the switching TFT T1 to control the light emission of the light emitting device 350.

The capacitor Cst may be provided in an overlap area between the gate electrode (N1) and the source electrode (N2) of the driving TFT T2 to store a voltage corresponding to a data signal supplied to the gate electrode of the driving TFT T2 and may turn on the driving TFT T2 with the stored voltage.

Optionally, each of the light emitting circuits EC may further include at least one compensation TFT for compensating for a shift of a threshold voltage of the driving TFT T2, and moreover, may further include at least one auxiliary capacitor. Each of the light emitting circuits EC may be additionally supplied with a compensation power such as an initialization voltage, based on the number of TFTs and auxiliary capacitors. Therefore, since each of the light emitting devices 350 is driven through a current driving manner identically to each subpixel of an organic light emitting display device, each of the light emitting circuits EC according to the present aspect may be changed to a pixel circuit of the organic light emitting display device known to those skilled in the art.

Figure 10:
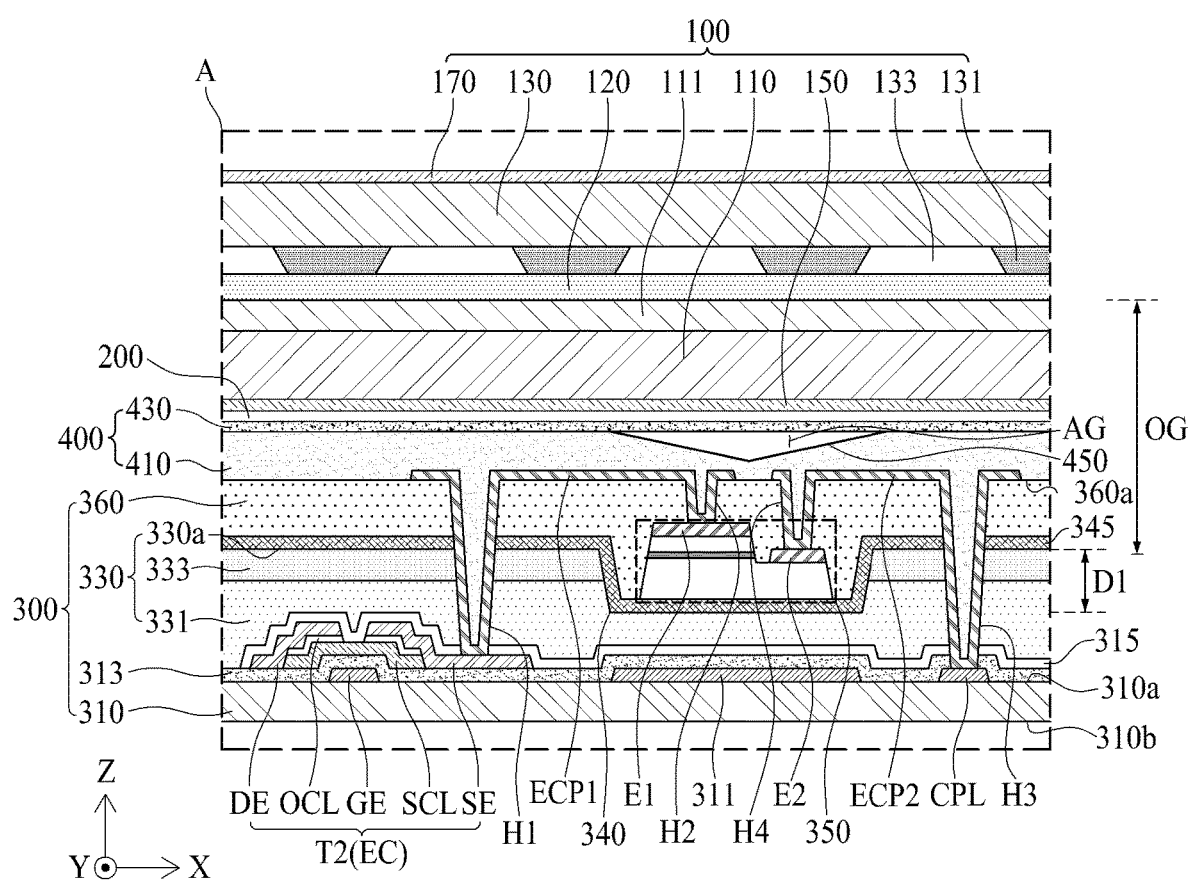
FIGS. 10 and 11 are other enlarged views illustrating a portion A illustrated in FIG. 1.

FIG. 10 is another enlarged view illustrating a portion A illustrated in FIG. 1 and is for describing a light source panel including the light emitting circuit illustrated in FIG. 9.

Referring to FIGS. 9 and 10, an LCD device according to the present aspect may include a liquid crystal display panel 100, a light source panel 300, an optical gap member 400, and a panel coupling member 200.

The liquid crystal display panel 100 is the same as the illustration of FIG. 2, and thus, its repetitive description is omitted.

The light source panel 300 may include a plurality of emissive areas EA defined on a base plate 310.

The plurality of emissive areas EA may each include a light emitting circuit EC, a planarization layer 330, a concave portion 340, a light emitting device 350, a passivation layer 360, a first electrode connection pattern ECP1, and a second electrode connection pattern ECP2.

The light emitting circuit CE may include a switching TFT T1, a driving TFT T2, and a capacitor C. The light emitting circuit CE is the same as the light emitting circuit of FIG. 9, and thus, its detailed description is omitted. Hereinafter, a structure of the driving TFT T2 will be described for example.

The driving TFT T2 may include a gate electrode GE, a semiconductor layer SCL, an ohmic contact layer OCL, a source electrode SE, and a drain electrode DE.

The gate electrode GE may be formed on a base plate 310 along with a light source scan line LSL. The gate electrode GE may be covered by a gate insulation layer 313. The gate insulation layer 313 may be formed of a single layer or a multilayer including an inorganic material, and may be formed of SiOx, SiNx, and/or the like.

The semiconductor layer SCL may be provided in a predetermined pattern (or an island form) form on the gate insulation layer 313 to overlap the gate electrode GE. The semiconductor layer SCL may be formed of a semiconductor material consisting of one of amorphous silicon, polycrystalline silicon, oxide, and an organic material, but is not limited thereto.

The ohmic contact layer OCL may be provided in a predetermined pattern (or an island form) form on the semiconductor layer SCL. Here, the ohmic contact layer OCL is for an ohmic contact between the semiconductor layer SCL and the source/drain electrode SE/DE and may be omitted.

The source electrode SE may be provided on one side of the ohmic contact layer OCL to overlap one side of the semiconductor layer SCL. The source electrode SE may be formed along with a light source data line LDL and a driving power line DPL.

The drain electrode DE may be spaced apart from the source electrode SE and may be provided on the other side of the ohmic contact layer OCL to overlap the other side of the semiconductor layer SCL. The drain electrode DE may be formed along with the source electrode SE and may branch or protrude from an adjacent driving power line DPL.

Additionally, the switching TFT T1 configuring the light emitting circuit EC may be provided to have the same structure as that of the driving TFT T2. In this case, the gate electrode of the switching TFT T1 may branch or protrude from the light source scan line LSL, the first electrode of the switching TFT T1 may branch or protrude from the light source data line LDL, and the second electrode of the switching TFT T2 may be connected to the gate electrode GE of the driving TFT T2 through a via hole provided in the gate insulation layer 313.

The light emitting circuit EC may be covered by an interlayer dielectric 315. The interlayer dielectric 315 may be provided on a whole surface of the base plate 310 to cover the light emitting circuit EC including the driving TFT T2. The interlayer dielectric 315 according to an aspect may be formed of an inorganic material such as SiOx and SiNx, or may be formed of an organic material such as benzocyclobutene or photo acryl. The interlayer dielectric 315 may be omitted.

The planarization layer 330 may be provided on the base plate 310 to cover a light source driving circuit unit including a plurality of light emitting circuits EC. That is, the planarization layer 330 may be provided all over a front surface of the base plate 310 to cover a plurality of light source data lines LDL or the interlayer dielectric 315. The planarization layer 330 may provide a planar surface on the light source driving circuit unit.

The planarization layer 330 according to an aspect may include a transparent layer 331 and a light blocking layer 333.

The transparent layer 331 may provide a first planar surface on the light source driving circuit unit and may be provided all over the front surface of the base plate 310 to cover a plurality of light source data lines LDL or the interlayer dielectric 315. For example, the transparent layer 331 may be formed of an organic material such as benzocyclobutene or photo acryl, and for example, for convenience of a process, the transparent layer 331 may be formed of photo acryl.

The light blocking layer 333 may provide a second planar surface on the light source driving circuit unit and may cover the transparent layer 331 other than a plurality of concave portions 340. The light blocking layer 333 may include a light absorbing material. For example, the light blocking layer 333 may be formed of the same material as that of a black matrix 131 provided on an upper substrate 130 of the liquid crystal display panel 100. The light blocking layer 333 prevents light corresponding to an area between adjacent emissive areas from traveling toward the base plate 310.

The concave portion 340, the passivation layer 360, and the light emitting device 350 are the same as the illustration of FIG. 2, and thus, their repetitive descriptions are omitted.

The first electrode connection pattern ECP1 may connect a first electrode E1 of the light emitting device 350 to a source electrode SE of the driving TFT T2. The first electrode connection pattern ECP1 according to an aspect may be provided on an upper surface 360a of the passivation layer 360 overlapping the first electrode E1 of the light emitting device 350 and the driving TFT T2. One side of the first electrode connection pattern ECP1 may be electrically connected to the source electrode SE of the driving TFT T2 through a first contact hole H1 passing through the interlayer dielectric 315, the planarization layer 330, and the passivation layer 360, and the other side of the first electrode connection pattern ECP1 may be electrically connected to the first electrode E1 of the light emitting device 350 through a second contact hole H2 passing through the passivation layer 360. Therefore, the first electrode E1 of the light emitting device 350 may be electrically connected to the source electrode SE of the driving TFT T2 through the first electrode connection pattern ECP1.

The second electrode connection pattern ECP2 may electrically connect a second electrode E2 of the light emitting device 350 to the common power line CPL. The second electrode connection pattern ECP2 may be provided on the upper surface 360a of the passivation layer 360 overlapping the second electrode E2 of the light emitting device 350 and the common power line CPL. Here, the second electrode connection pattern ECP2 may be formed of the same material as that of the first electrode connection pattern ECP1.

One side of the second electrode connection pattern ECP2 may be electrically connected to the common power line CPL through a third contact hole H3 passing through the gate insulation layer 313, the interlayer dielectric 315, the planarization layer 330, and the passivation layer 360 which overlap the common power line CPL. The other side of the second electrode connection pattern ECP2 may be electrically connected to the second electrode E2 of the light emitting device 350 through a second electrode contact hole CH2 which is provided in the planarization layer 330 to overlap the second electrode E2 of the light emitting device 350. Therefore, the second electrode E2 of the light emitting device 350 may be electrically connected to the common power line CPL through the second electrode connection pattern ECP2.

The plurality of first and second electrode connection patterns ECP1 and ECP2 according to an aspect may be simultaneously provided through an electrode patterning process using a lithography process, an etching process, and a deposition process of depositing an electrode material on the passivation layer 360 including the first to fourth contact holes H1 to H4. Therefore, in the present aspect, since the plurality of first and second electrode connection patterns ECP1 and ECP2 for connecting the first and second electrodes E1 and E2 of each of the plurality of light emitting devices 350 to the light source driving circuit unit 320 are simultaneously formed, an electrode connection process is simplified, and a process time taken in the electrode connection process is considerably shortened, thereby enhancing a productivity of the light source panel 300.

Each of the plurality of first and second electrode connection patterns ECP1 and ECP2 may be provided on a corresponding light emitting device of the light emitting devices 350. If the light source panel 300 has a top emission type, each of the plurality of first and second electrode connection patterns ECP1 and ECP2 may be formed of a transparent conductive material, and if the light source panel 300 has a bottom emission type, each of the plurality of first and second electrode connection patterns ECP1 and ECP2 may be formed of a light reflection conductive material.

The light source panel 300 according to an aspect may further include a plurality of reflective patterns 311, which are provided between the concave portion 340 and the base plate 310 to overlap an emissive area EA, and an adhesive member 345 which attaches the light emitting device 350 on a floor of the concave portion 340. The plurality of reflective patterns 311 and the adhesive member 345 are the same as the details described above with reference to FIG. 5, and thus, their repetitive descriptions are omitted.

Optionally, in the LCD device according to the present aspect, as illustrated in FIG. 6, the optical gap member 400 may include a wavelength converting material 420.

Optionally, the LCD device according to the present aspect may include the plurality of gap spacers GS illustrated in FIG. 2, instead of the optical gap member 400 provided between the light source panel 300 and the liquid crystal display panel 100.

Figure 11:
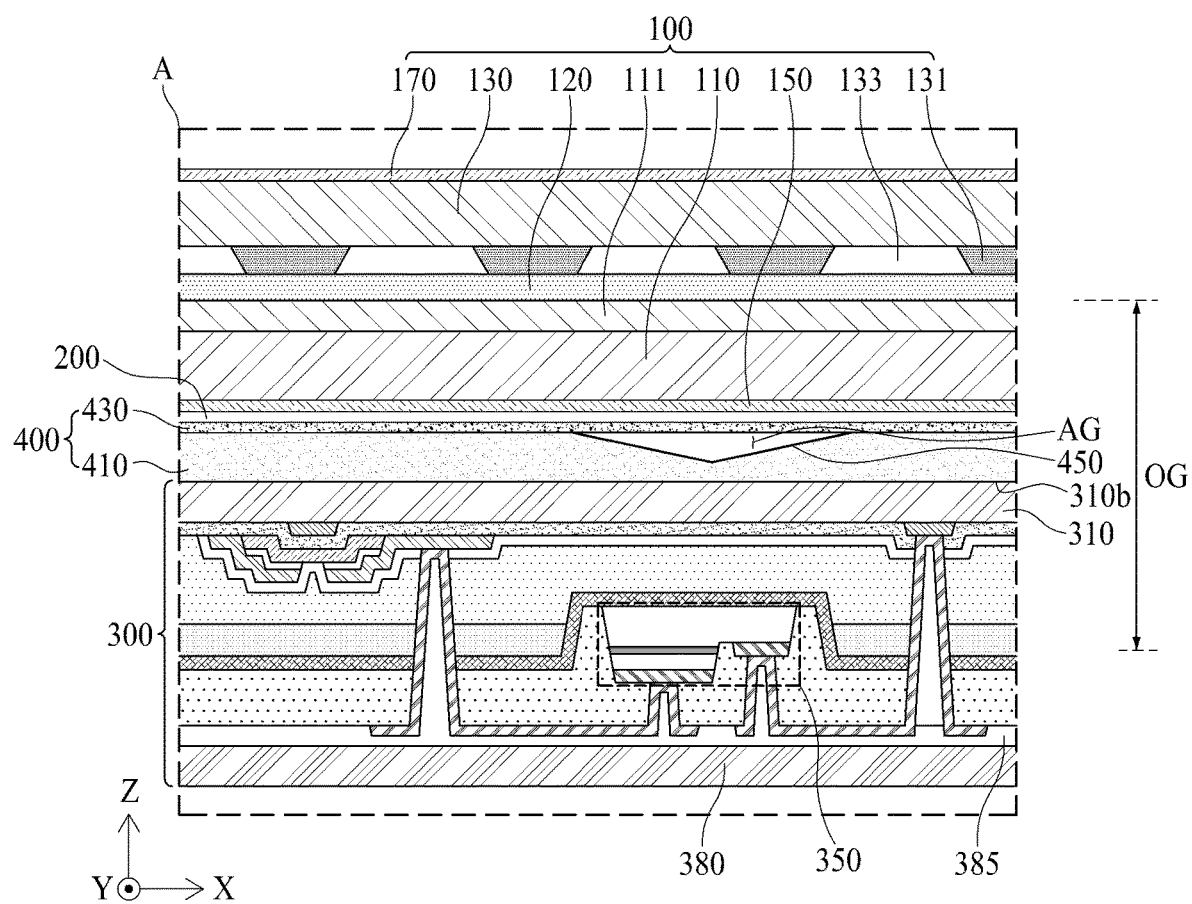

FIG. 11 is another enlarged view illustrating in more detail a portion A illustrated in FIG. 1 and illustrates an example which is implemented by modifying a bonding structure of the light source panel and the liquid crystal display panel illustrated in FIG. 10. Hereinafter, therefore, only a bonding structure of a light source panel and a liquid crystal display panel and elements relevant thereto will be described, and descriptions of the other elements are omitted.

Referring to FIG. 11, a light source panel 300 according to the present aspect may be vertically reversed and may be coupled to a rear surface of a liquid crystal display panel 100. That is, a base plate 310 of the light source panel 300 may be coupled to a lower substrate 110 (or a lower polarization member) of the liquid crystal display panel 100 by using a panel coupling member 200.

The panel coupling member 200 according to an aspect may include an OCA, an OCR, a porous OCA, or a porous OCR, or in order to provide an air gap between the liquid crystal display panel 100 and the light source panel 300, the panel coupling member 200 may include a porous OCA or a porous OCR.

The base plate 310 of the light source panel 300 and the lower substrate 110 of the liquid crystal display panel 100 may be opposite-bonded to each other through a direct bonding process using the panel coupling member 200. Therefore, since the light source panel 300 is coupled to a rear surface of the liquid crystal display panel 100 through vertical reverse, the light source panel 300 may have a bottom emission structure, and thus, a reflective pattern 311 provided in the base plate 310 may be omitted.

The base plate 310 of the light source panel 300 coupled to the lower substrate 110 of the liquid crystal display panel 100 may act as an optical gap member which provides an optical gap OG between an light emitting layer EL of the light emitting device 350 and a liquid crystal layer 120 of the liquid crystal display panel 100. Therefore, in the present aspect, the optical gap member 400 illustrated in FIG. 10 may be omitted, and moreover, the gap spacer illustrated in FIG. 2 may be omitted.

Additionally, since the base plate 310 is coupled to the lower substrate 110 of the liquid crystal display panel 100, the light source panel 300 may further include a reflector 380 covering a whole front surface of the base plate 310.

The reflector 380 may be attached on a front surface of the base plate 310 by using a transparent adhesive member 385 such as an OCA or an OCR. The reflector 380 according to an aspect may include a material having a high reflectance.

Optionally, as illustrated in FIG. 8, the base plate 310 of the light source panel 300 may be coupled to a rear surface of the optical gap member 400, and in this case, the optical gap OG may be additionally secured based on a thickness of the optical gap member 400.

Since the light source panel 300 according to the present aspect is vertically reversed and is coupled to the rear surface of the liquid crystal display panel 100 or the optical gap member 400, an optical gap OG is secured by the base plate 310 of the light source panel 300, thereby minimizing or preventing hot spots.

Figure 12:
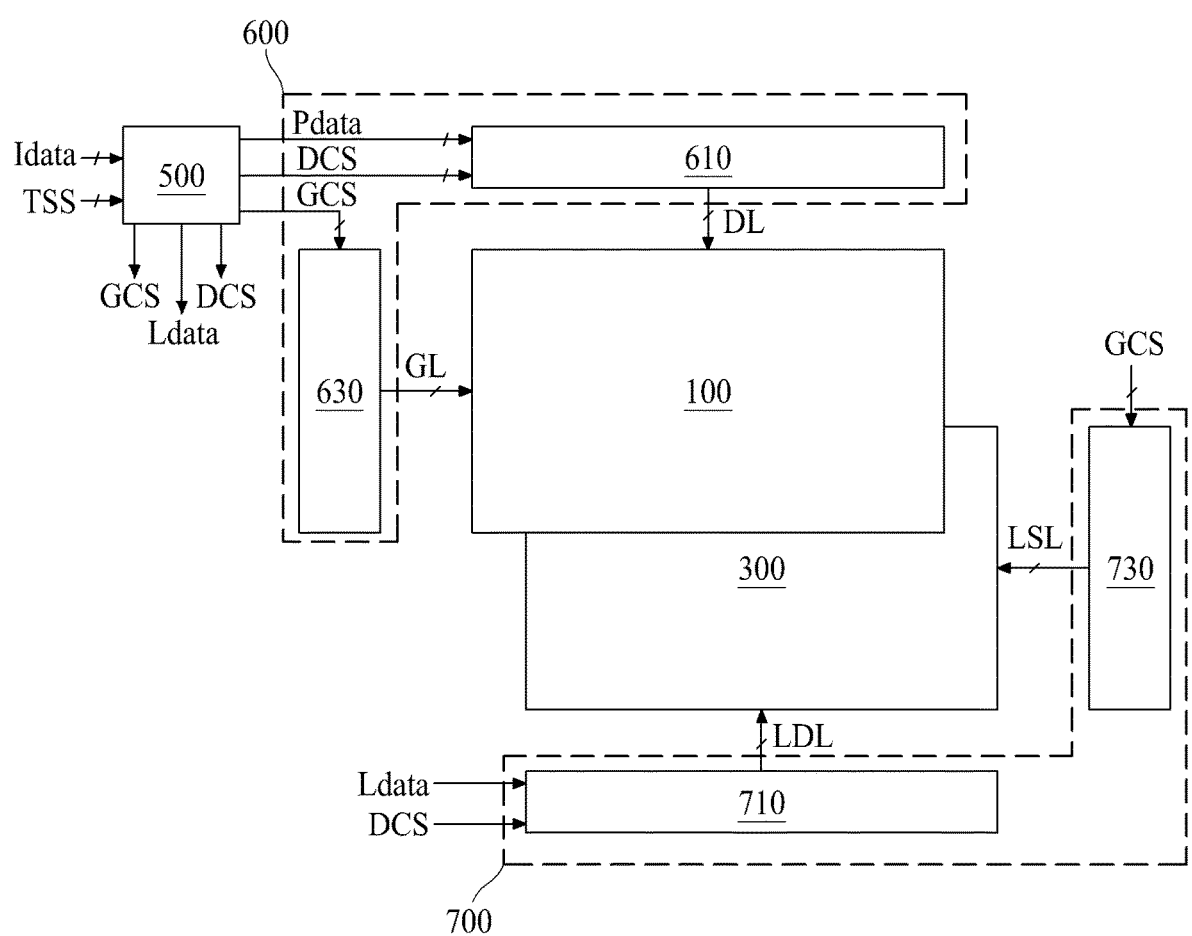
FIG. 12 is a diagram illustrating an LCD device according to an aspect of the present disclosure.

FIG. 12 is a diagram illustrating an LCD device according to an aspect of the present disclosure.

Referring to FIG. 12, the LCD device according to an aspect of the present disclosure may include a liquid crystal display panel 100, a light source panel 300, a timing controller 500, a display panel driver 600, and a light source panel driver 700.

The liquid crystal display panel 100 may include a plurality of pixels respectively provided in a plurality of pixel areas defined by intersections of a plurality of gate lines and a plurality of data lines. The liquid crystal display panel 100 has the same configuration as that of the liquid crystal display panel illustrated in one of FIGS. 1, 4 to 8, 10, and 11, and thus, its detailed description is omitted.

The light source panel 300 may include a plurality of light emitting circuits respectively provided in a plurality of emissive areas defined by a plurality of light source scan lines and a plurality of light source data lines. The light source panel 300 has the same configuration as that of the light source panel illustrated in one of FIGS. 1, 4 to 8, 10, and 11, and thus, its detailed description is omitted.

Additionally, the light source panel 300 according to the present aspect may include a plurality of light emitting groups each including one or more light emitting devices. Each of the plurality of light emitting groups may emit light by units of groups through local dimming driving to locally irradiate light onto the liquid crystal display panel 100.

The light source panel 300 of the liquid crystal display panel 100 may be opposite-bonded to each other to have the same structure as that of the LCD device illustrated in one of FIGS. 1, 4 to 8, 10, and 11, and thus, their detailed descriptions are omitted.

The timing controller 500 may receive a timing sync signal TSS and digital video data Idata supplied from a host system, align the digital video data Idata according to a pixel arrangement structure of the liquid crystal display panel 100 to generate pixel-based pixel data Pdata, based on the timing sync signal TSS, and may supply the pixel-based pixel data Pdata to the display panel driver 600.

The timing controller 500 may generate a data control signal DCS and a gate control signal GCS, based on the timing sync signal TSS and may supply the data control signal DCS and the gate control signal GCS to the display panel driver 600 and the light source driver 700.

Simultaneously, the timing controller 500 may control the light emission of the light source panel 300 through local dimming technology, thereby partially controlling a luminance of light irradiated onto the liquid crystal display panel 100. For example, the timing controller 500 may divide the liquid crystal display panel 100 into a plurality of local dimming blocks according to a resolution, analyze pixel data Pdata of pixels included in each of the local dimming blocks for each block to generate block-based light source data Ldata, and supply the generated block-based light source data Ldata to the light source panel driver 700. Here, one local dimming block may include pixels overlapping one or more emissive areas provided in the light source panel 300. Also, the block-based light source data Ldata may have a block-based average gray level value or a gray level value having a maximum frequency number.

The display panel driver 600 may display an image on the liquid crystal display panel 100 according to control by the timing controller 500. The display panel driver 600 according to an aspect may include a data driving circuit 610 and a gate driving circuit 630.

The data driving circuit 610 may receive the pixel data Pdata and the data control signal DCS supplied from the timing controller 500, convert the pixel data Pdata into an analog pixel data signal, based on the received data control signal DCS, and supply the analog pixel data signal to a corresponding data line.

The gate driving circuit 630 may receive the gate control signal GCS supplied from the timing controller 500, generate a gate signal based on the received gate control signal GCS, and supply the gate signal to a corresponding gate line. Optionally, the gate driving circuit 630 may be a shift register circuit which is directly provided in a non-display area of one side of a lower substrate of the liquid crystal display panel 100 so as to be connected to the plurality of gate lines in a one-to-one relationship.

The light source panel driver 700 may allow the light source panel 300 to emit light according to control by the timing controller 500, thereby allowing the light emitted from the light source panel 300 to be irradiated onto the rear surface of the liquid crystal display panel 100. The light source panel driver 700 according to an aspect may include a light source data driving circuit 710 and a light source scan driving circuit 730.

The light source data driving circuit 710 may receive the block-based light source data Ldata and the data control signal DCS supplied from the timing controller 500, convert the block-based light source data Ldata into an analog light source data signal, based on the received data control signal DCS, and supply the analog light source data signal to a corresponding light source data line.

The light source scan driving circuit 730 may receive the gate control signal GCS supplied from the timing controller 500, generate a light source scan signal based on the received gate control signal GCS, and supply the light source scan signal to a corresponding light source scan line.

Since the LCD device according to the present aspect uses the light source panel 300 including the plurality of light emitting devices as a backlight, the LCD device according to the present aspect has a thickness which is thinner than the related art LCD device, and the light source panel 300 may be driven in a passive matrix driving manner or an active matrix driving manner, thereby realizing partial luminance by units of one or more unit pixels.

As described above, the LCD device according to the aspects of the present disclosure has a thin thickness and realizes partial luminance, and particularly, realizes partial luminance by units of at least one unit pixel.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A liquid crystal display (LCD) device comprising:
   a liquid crystal display panel including a lower substrate and an upper substrate attached to each other with a liquid crystal layer therebetween; and
   a light source panel coupled to the liquid crystal display panel,
   wherein the light source panel comprises,
   a plurality of emissive areas defined on a base plate;
   a plurality of light emitting devices corresponding to the plurality of emissive areas, each of the plurality of light emitting devices including a first electrode and a second electrode;
   an adhesive member between each of the plurality of light emitting devices and the base plate;
   a source scan line on the base plate and connected to the first electrode of the light emitting device;
   a light source data line on the base plate and connected to the second electrode of the light emitting device;
   a first planarization layer covering the plurality of light source scan lines and the plurality of light source data lines, surrounding lateral side surfaces of each of the plurality of light emitting devices;

a second planarization layer disposed on the first planarization layer and the plurality of light emitting devices;

a first electrode connection pattern on the second planarization layer, connecting the first electrode of the plurality of light emitting devices to the light source data line; and a plurality of second electrode connection patterns on the second planarization layer, connecting the second electrode of the plurality of light emitting devices to the light source scan line, wherein each of the plurality of light emitting devices is embedded in the second planarization layer, wherein each of the plurality of light emitting devices comprises a first portion and a second portion opposite to the first portion, the first portion including the first electrode and the second electrode, and wherein the adhesive member is between the second portion and the base plate.

2. The LCD device of claim 1, further comprising an optical gap member between the liquid crystal display panel and the light source panel.

3. The LCD device of claim 2, wherein the optical gap member includes a transparent material layer on the plurality of emissive areas.

4. The LCD device of claim 3, wherein the plurality of light emitting devices includes a micro white light emitting diode chip emitting light having a first color, and the optical gap member includes a wavelength converting material converting part of the light having the first color into light having a second color.

5. The LCD device of claim 4, wherein the wavelength converting material includes a phosphor or a quantum dot.

6. The LCD device of claim 3, wherein the optical gap member has a plurality of lens patterns protruding toward and vertically overlapping the plurality of light emitting devices.

7. The LCD device of claim 6, wherein the plurality of lens patterns has a cone-shaped or dome-shaped cross-sectional surface.

8. The LCD device of claim 6, wherein the plurality of light emitting devices includes a micro white light emitting diode chip emitting light having a first color, and the optical gap member includes a wavelength converting material converting part of the light having the first color into light having a second color.

9. The LCD device of claim 2, wherein the base plate of the light source panel is attached to the optical gap member.

10. The LCD device of claim 9, wherein the light source panel further comprises a reflective member covering each of the plurality of light emitting devices, and wherein the plurality of light emitting devices are between the base plate and the reflective member.

11. The LCD device of claim 1, wherein the plurality of light emitting devices includes a micro white light emitting diode chip emitting white light.

12. The LCD device of claim 1, further comprising a gap spacer between the liquid crystal display panel and the light source panel and providing an air gap.

13. The LCD device of claim 1, wherein the light source panel further comprise:

a light source driving circuit unit including the source scan line and the light source data line respectively connected to the plurality of light emitting devices, disposed on the base plate, and respectively defining the plurality of emissive areas; and a planarization layer covering the light source driving circuit unit, wherein the plurality of light emitting devices are disposed on the planarization layer, and wherein a distance between the first portion to the base plate is greater than a distance between the second portion to the base plate.

14. The LCD device of claim 13, further comprising, a first electrode connection pattern on the planarization layer, connecting the first electrode of the plurality of light emitting devices to the light source data line; and a plurality of second electrode connection patterns on the planarization layer, connecting the second electrode of the plurality of light emitting devices to the light source scan line.

15. The LCD device of claim 13, wherein the planarization layer comprises:

a transparent layer covering the light source driving circuit unit; and a light blocking layer covering the transparent layer except for each of an area corresponding to the plurality of light emitting devices.

16. The LCD device of claim 1, wherein the light source panel further comprise:

a plurality of light emitting circuits each including a common power line and a driving thin film transistor connected to a light emitting device in each of the plurality of emissive areas; and a planarization layer covering the plurality of light emitting circuits, wherein the plurality of light emitting devices are disposed on the planarization layer, wherein a distance between the first portion to the base plate is greater than a distance between the second portion to the base plate, and wherein each of the plurality of light emitting circuits is connected to the source scan line and the light source data line.

17. The LCD device of claim 16, wherein the light source panel further comprising:

a plurality of first electrode connection patterns on the planarization layer, connecting the first electrode of the plurality of light emitting devices to a driving thin film transistor; and a plurality of second electrode connection patterns on the planarization layer, connecting the second electrode of the plurality of light emitting devices to a common power line.

18. The LCD device of claim 1, wherein the light source panel further comprises a plurality of reflective patterns between the base plate and each of the plurality of light emitting devices.

19. The LCD device of claim 1, wherein the base plate of the light source panel is attached to the liquid crystal display panel.

20. The LCD device of claim 1, wherein the light source panel includes a plurality of light emitting groups each including one or more light emitting devices, and each of the plurality of light emitting groups emits light by units of groups.

21. The LCD device of claim 1, wherein the adhesive member is between each of the plurality of light emitting devices and the first planarization layer, and wherein the second portion is attached to the adhesive member.

22. The LCD device of claim 1, wherein the light source panel further comprises an interlayer dielectric provided on the base plate to cover the source scan line and the light source data line, wherein the adhesive member is between the second portion and the interlayer dielectric.

23. A liquid crystal display (LCD) device including a liquid crystal display panel having a liquid crystal layer and a light source panel attached to each other, the light source panel comprising:

an emissive area on a base plate of the light source panel;
a light emitting device corresponding to the emissive area, the light emitting device including a first electrode and a second electrode;
an adhesive member between the light emitting devices and the base plate;
an optical gap member configured to provide an optical gap between the light emitting device and the liquid crystal layer;
a source scan line on the base plate and connected to the first electrode of the light emitting device;
a light source data line on the base plate and connected to the second electrode of the light emitting device;
a first planarization layer covering the light source scan line and the light source data line, surrounding lateral side surfaces of the light emitting device;
a second planarization layer disposed on the first planarization layer and the light emitting device;
a first electrode connection pattern on the second planarization layer, connecting the first electrode of the light emitting device to the light source data line; and
a second electrode connection pattern on the second planarization layer, connecting the second electrode of the light emitting device to the light source scan line, wherein the light emitting device is embedded in the second planarization layer, wherein the light emitting device comprises a first portion and a second portion opposite to the first portion, the first portion including the first electrode and the second electrode, and wherein the adhesive member is between the second portion and the base plate.

24. The LCD device of claim 23, wherein the optical gap member has a lens pattern protruding toward and vertically overlapping the light emitting device.

25. The LCD device of claim 24, wherein the lens patterns has a cone-shaped or dome-shaped cross-sectional surface.

26. The LCD device of claim 23, wherein the light emitting device includes a micro white light emitting diode chip emitting light having a first color, and the optical gap member includes a wavelength converting material converting part of the light having the first color into light having a second color.

27. The LCD device of claim 23, further comprising a gap spacer between the liquid crystal display panel and the light source panel and providing an air gap.

28. The LCD device of claim 23, wherein the adhesive member is between the light emitting devices and the first planarization layer, and wherein the second portion is attached to the adhesive member.

29. The LCD device of claim 23, wherein the light source panel further comprises an interlayer dielectric provided on the base plate to cover the source scan line and the light source data line, wherein the adhesive member is between the second portion and the interlayer dielectric.

* * * * *